(12) United States Patent
Sung et al.

(10) Patent No.: US 9,449,946 B2
(45) Date of Patent: Sep. 20, 2016

(54) SEMICONDUCTOR DEVICE AND MANUFACTURING METHOD THEREOF

(71) Applicant: Amkor Technology, Inc., Chandler, AZ (US)

(72) Inventors: Pil Je Sung, Seoul (KR); Seong Min Seo, Seoul (KR); Jong Sik Paek, Incheon (KR); Seo Yeon Ahn, Chungju-si (KR); Hui Tae Kim, Chungcheongbuk-do (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/218,265

(22) Filed: Mar. 18, 2014

(65) Prior Publication Data
US 2014/0284785 A1 Sep. 25, 2014

(30) Foreign Application Priority Data
Mar. 22, 2013 (KR) .................. 10-2013-0031129

(51) Int. Cl.
*H01L 21/00* (2006.01)
*H01L 25/065* (2006.01)
(Continued)

(52) U.S. Cl.
CPC ....... *H01L 25/0657* (2013.01); *H01L 23/3135* (2013.01); *H01L 25/50* (2013.01); *H01L 21/568* (2013.01); *H01L 24/05* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 25/0655* (2013.01); *H01L 2224/0401* (2013.01);
(Continued)

(58) Field of Classification Search
CPC .......... H01L 2224/16145; H01L 2224/13022; H01L 2224/81005; H01L 2224/13023; H01L 23/481; H01L 23/3128; H01L 25/0657; H01L 21/568; H01L 2225/06541; H01L 2225/06513
See application file for complete search history.

(56) References Cited

U.S. PATENT DOCUMENTS 6,577,013 B1 * 6/2003 Glenn et al. .................. 257/777
8,604,615 B2 * 12/2013 Lee et al. ...................... 257/737
(Continued)

FOREIGN PATENT DOCUMENTS

| KR | 10-0843214 B1 | 7/2008 |
| KR | 2009-0120855 A | 11/2009 |
| KR | 2012-0012602 A | 2/2012 |

*Primary Examiner* — A. Sefer
(74) *Attorney, Agent, or Firm* — McAndrews, Held & Malloy, Ltd.

(57) ABSTRACT

Disclosed are a semiconductor device and a manufacturing method thereof, which can achieve miniaturization and improvement in the integration level by forming a substrate using a pattern layer implemented on a wafer in a semiconductor fabrication (FAB) process. In one exemplified embodiment, the manufacturing method of the semiconductor device includes preparing a first semiconductor die including a plurality of through electrodes and a plurality of first conductive pillars, mounting the first semiconductor die to connect the first conductive pillars to the pattern layer provided on a wafer, forming a first encapsulant to cover the pattern layer and the first semiconductor die, mounting a second semiconductor die to electrically connect second conductive pillars provided in the second semiconductor die to the plurality of through electrodes exposed to a second surface of the first semiconductor die, and removing the wafer from a first surface of the pattern layer.

17 Claims, 15 Drawing Sheets

(51) Int. Cl.
*H01L 25/00* (2006.01)
*H01L 23/31* (2006.01)
*H01L 21/56* (2006.01)
*H01L 23/00* (2006.01)

(52) U.S. Cl.
CPC  *H01L 2224/0557* (2013.01); *H01L 2224/131* (2013.01); *H01L 2224/13025* (2013.01); *H01L 2224/13082* (2013.01); *H01L 2224/13147* (2013.01); *H01L 2224/16145* (2013.01); *H01L 2224/32145* (2013.01); *H01L 2224/32245* (2013.01); *H01L 2224/73204* (2013.01); *H01L 2224/73253* (2013.01); *H01L 2224/81005* (2013.01); *H01L 2224/83005* (2013.01); *H01L 2224/92125* (2013.01); *H01L 2225/06513* (2013.01); *H01L 2225/06517* (2013.01); *H01L 2225/06527* (2013.01); *H01L 2225/06541* (2013.01); *H01L 2225/06589* (2013.01); *H01L 2924/10253* (2013.01); *H01L 2924/15311* (2013.01); *H01L 2924/16251* (2013.01); *H01L 2924/16724* (2013.01); *H01L 2924/16747* (2013.01); *H01L 2924/18161* (2013.01)

(56) References Cited

U.S. PATENT DOCUMENTS

| | | | |
|---|---|---|---|
| 2007/0126085 A1* | 6/2007 | Kawano et al. | 257/621 |
| 2007/0287265 A1* | 12/2007 | Hatano et al. | 438/458 |
| 2008/0211081 A1 | 9/2008 | Lee | |
| 2010/0140779 A1* | 6/2010 | Lin et al. | 257/690 |
| 2010/0144091 A1* | 6/2010 | Kawano et al. | 438/107 |
| 2010/0327439 A1* | 12/2010 | Hwang et al. | 257/737 |
| 2011/0031598 A1* | 2/2011 | Lee et al. | 257/686 |
| 2011/0057327 A1* | 3/2011 | Yoshida et al. | 257/777 |
| 2011/0062592 A1* | 3/2011 | Lee et al. | 257/774 |
| 2011/0237026 A1* | 9/2011 | Farooq et al. | 438/107 |
| 2012/0028412 A1 | 2/2012 | Jeong et al. | |
| 2012/0088332 A1* | 4/2012 | Lee et al. | 438/113 |
| 2013/0062701 A1 | 3/2013 | Lee et al. | |
| 2013/0082399 A1* | 4/2013 | Kim et al. | 257/774 |
| 2013/0175702 A1* | 7/2013 | Choi et al. | 257/774 |
| 2014/0084456 A1* | 3/2014 | Kang et al. | 257/737 |
| 2014/0131856 A1* | 5/2014 | Do et al. | 257/737 |
| 2014/0131886 A1* | 5/2014 | Paek et al. | 257/774 |

\* cited by examiner

SEMICONDUCTOR DEVICE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2013-0031129, filed on Mar. 22, 2013, the contents of which are hereby incorporated herein by reference, in their entirety.

FIELD OF THE INVENTION

The present disclosure relates to a semiconductor device and a manufacturing method thereof.

BACKGROUND OF THE INVENTION

In general, a semiconductor device includes a semiconductor die formed by processing a wafer and forming an integrated circuit (IC) on the wafer. The semiconductor device is completed by a structure in which the semiconductor die is mounted on a substrate, such as a lead frame or a printed circuit board.

The substrate that may be implemented in a semiconductor package process generally has a thickness in a range between 200 and 300 μm. In addition, the substrate used in a semiconductor package process may have a plurality of through electrodes to enable top and bottom surfaces of the substrate to be electrically connected to each other. Conductive patterns and through electrodes included in the substrate may have a line width ranging between 10 to 20 μm. The thickness of the conductive pattern that can be implemented in a semiconductor package process may be considerably greater than the thickness of the pattern formed on a wafer in a semiconductor fabrication (FAB) process. Thus, the cost of forming the conductive pattern and the thickness of the conductive pattern may be greater than desired.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY OF THE INVENTION

A semiconductor device and manufacturing method thereof, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION OF THE INVENTION

Figure 1:
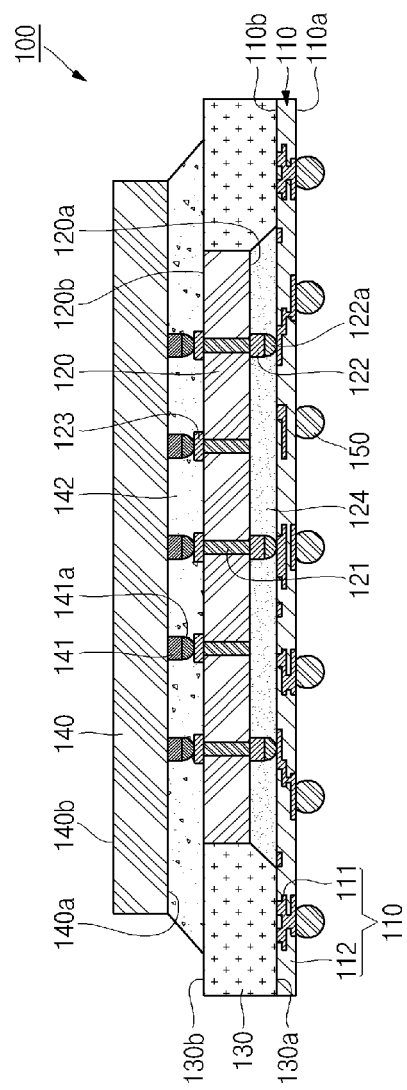
FIG. 1 is a cross-sectional view of an exemplary semiconductor device, in accordance with a representative embodiment of the present disclosure.

Aspects of the present disclosure relate to a semiconductor device and a manufacturing method thereof. More specifically, representative embodiments of the present disclosure may relate to a semiconductor device and a method of manufacturing such a semiconductor device, where the semiconductor device includes a plurality of semiconductor die, and in which the manner of manufacture reduces the size of the semiconductor device.

Various aspects of the present disclosure will be described in more detail with reference to the accompanying drawings. Those skilled in the art will easily realize various aspects of the present disclosure upon reading the present patent application.

It should be noted that the thickness or size of each layer may be exaggerated for clarity in the accompanying drawings, and that like reference numerals may refer to like elements. Additionally, the term "semiconductor die" in this specification includes, for example, a semiconductor chip having an active circuit and/or a passive circuit, a semiconductor wafer, or equivalents thereof.

As utilized herein, the term "exemplary" means serving as a non-limiting example, instance, or illustration. Also, as utilized herein, the term "representative" means serving as a non-limiting example, instance, or illustration.

Hereinafter, examples of embodiments of the present disclosure will be described in detail with reference to the accompanying drawings such that they can easily be made and used by those skilled in the art. Like numbers refer to like elements throughout. In addition, when it is said that an element is electrically coupled to another element, it will be understood that these elements are directly coupled to each other and are coupled to each other with another element interposed therebetween.

FIG. 1 is a cross-sectional view of an exemplary semiconductor device, in accordance with a representative embodiment of the present disclosure.

As illustrated in FIG. 1, the semiconductor device 100 includes a pattern layer 110, a first semiconductor die 120 having a plurality of through electrodes 121 and first conductive pillars 122, a first encapsulant 130 encapsulating the first semiconductor die 120, a second semiconductor die 140 having second conductive pillars 141, and conductive members 150 formed on the pattern layer 110.

The illustrated pattern layer 110 includes conductive pattern 111 and a dielectric layer 112. The conductive pattern 111 is electrically protected by the dielectric layer 112. The conductive pattern 111 may have a multi-layered structure, but aspects of the present disclosure are not limited thereto. The conductive pattern 111 is exposed to the outside through a first surface 110a and a second surface 110b of the pattern layer 110. The conductive pattern 111 exposed to the outside through the first and second surfaces 110a and 110b of the pattern layer 110 may have a relatively large width to facilitate bumping in a later stage. A portion of the conductive pattern 111 having the relatively large width may be defined as a conductive pad.

As shown in FIG. 1, the conductive pattern 111 exposed to the first surface 110a of the pattern layer 110 may be connected to the conductive members 150, and the conductive pattern 111 exposed to the second surface 110b of the pattern layer 110 may be connected to the first conductive pillars 122 of the first semiconductor die 120. In the pattern layer 110, the first surface 110a may be a bottom surface, the second surface 110b may be a top surface, and a surface connecting the first surface 110a and the second surface 110b may be a lateral surface.

The pattern layer 110 may be implemented on a wafer in a semiconductor FAB process. A thickness of the pattern layer 110, corresponding to a distance between the first surface 110a and the second surface 110b of the pattern layer 110 implemented in the semiconductor FAB process, may be in a range of 1 to 10 μm, and the conductive pattern 111 may have a line width in a range of 0.1 to 20 μm. As may be known to the reader, a line width implemented in a semiconductor packaging process may be considerably greater than a line width implemented in a semiconductor FAB process. In a representative embodiment of the present disclosure, the semiconductor device 100 may be reduced in size due to a reduction in the thickness of the pattern layer 110, and the conductive pattern 111 can be formed as a fine pattern, and miniaturization and improvement in the integration level can be achieved.

As shown in FIG. 1, the first semiconductor die 120 is in the shape of a plate having a first surface 120a that is substantially planar and a second surface 120b opposite to the first surface 120a. The first surface 120a of the first semiconductor die 120 faces the second surface 110b of the pattern layer 110. The first semiconductor die 120 includes a plurality of through electrodes 121 passing through a region between the first surface 120a and the second surface 120b. In addition, the first semiconductor die 120 includes a plurality of first conductive pillars 122 formed on the first surface 120a to be connected to the through electrodes 121 exposed to the first surface 120a. Further, the first semiconductor die 120 includes a plurality of first conductive pads 123 formed on the second surface 120b to be connected to the through electrodes 121 exposed to the second surface 120b. The through electrodes 121 electrically connect the first conductive pillars 122 formed on the first surface 120a of the first semiconductor die 120 to the conductive pads 123 formed on the second surface 120b of the first semiconductor die 120. The first conductive pillars 122 may be connected to the conductive pattern 111 of the pattern layer 110 and a solder cap 122a formed at an end of each of the first conductive pillars 122 to be easily connected to the conductive pattern 111. The conductive pads 123 are connected to the second conductive pillars 141 of the second semiconductor die 140.

As shown in the example of FIG. 1, a first underfill 124 may fill a gap between the first semiconductor die 120 and the pattern layer 110. The first underfill 124 improves physical and mechanical coupling forces between the first semiconductor die 120 and the pattern layer 110 and prevents the first semiconductor die 120 and the pattern layer 110 from being separated from each other by stress generated due to a difference in thermal expansion coefficients of the first semiconductor die 120 and the pattern layer 110.

The first semiconductor die 120 may include, by way of example, a general silicon semiconductor, a compound semiconductor, and equivalents thereof, but not limited thereto.

The first encapsulant 130 encapsulates the first semiconductor die 120 connected to the second surface 110b of the pattern layer 110 to protect the first semiconductor die 120 from external environment factors. In a representative embodiment of the present disclosure, the first encapsulant 130 encapsulates the second surface 110b of the pattern layer 110 and a surface of the first semiconductor die 120. As shown in FIG. 1, the second surface 120b of the first semiconductor die 120 is exposed to the outside from the first encapsulant 130.

As illustrated in the example of FIG. 1, a lateral surface of the first encapsulant 130 may be coplanar with a lateral surface of the pattern layer 110, the first surface 130a may make contact with the second surface 110b of the pattern layer 110, and the second surface 130b may be coplanar with the second surface 120b of the first semiconductor die 120. The first encapsulant 130 may, by way of example and not limitation, be made of an epoxy resin that is an electrically insulating material.

As also shown in the example of FIG. 1, the second semiconductor die 140 is in the shape of a plate having a first surface 140a that is substantially planar and a second surface 140b opposite to the first surface 140a. The first surface 140a of the second semiconductor die 140 faces the second surface 120b of the first semiconductor die 120. The second semiconductor die 140 includes second conductive pillars 141 formed on the second surface 140a to be electrically connected to the first semiconductor die 120. The second conductive pillars 141 may, for example, be made of copper, but aspects of the present disclosure are not limited thereto.

The second conductive pillars 141 are connected to the first semiconductor die 120. More specifically, as shown in FIG. 1, the second conductive pillars 141 are connected to the conductive pads 123 of the first semiconductor die 120 to then be electrically connected to the through electrodes 121 and the first semiconductor die 120. The second conductive pillars 141 may include a solder cap 141a formed at an end of each of the second conductive pillars 141 to be easily connected to the conductive pads 123. In the manner described, the second conductive pillars 141 are electrically connected to conductive pads 123 formed on the second surface 120b of the first semiconductor die 120.

A second underfill 142 may be between the second semiconductor die 140 and the first semiconductor die 120. The second underfill 142 improves physical and mechanical coupling forces between the second semiconductor die 140 and the first semiconductor die 120 and electrically protects the second conductive pillars 141 that electrically connect the second semiconductor die 140 and the conductive pads 123 of the first semiconductor die 120.

The conductive members 150 are electrically connected to the first surface 110a of the pattern layer 110, which is opposite to a surface on which the first semiconductor die 120 is mounted. The conductive members 150 may, for example, be solder balls (i.e., solder in the shape of a ball). The conductive members 150 are electrically connected to the conductive pattern 111 exposed to the first surface 110a of the pattern layer 110. The solder balls as the conductive members 150 allow the semiconductor device 100 according to the present disclosure to be mounted on, by way of example and not limitation, a mother board or a main board of an electronic device, such as a computer or a smart phone, for example.

In accordance with a representative embodiment of the present disclosure, the example semiconductor device 100 of FIG. 1 uses a pattern layer implemented on a wafer in a semiconductor fabrication (FAB) process as a substrate, thereby achieving miniaturization and an improved integration level.

Figure 2:
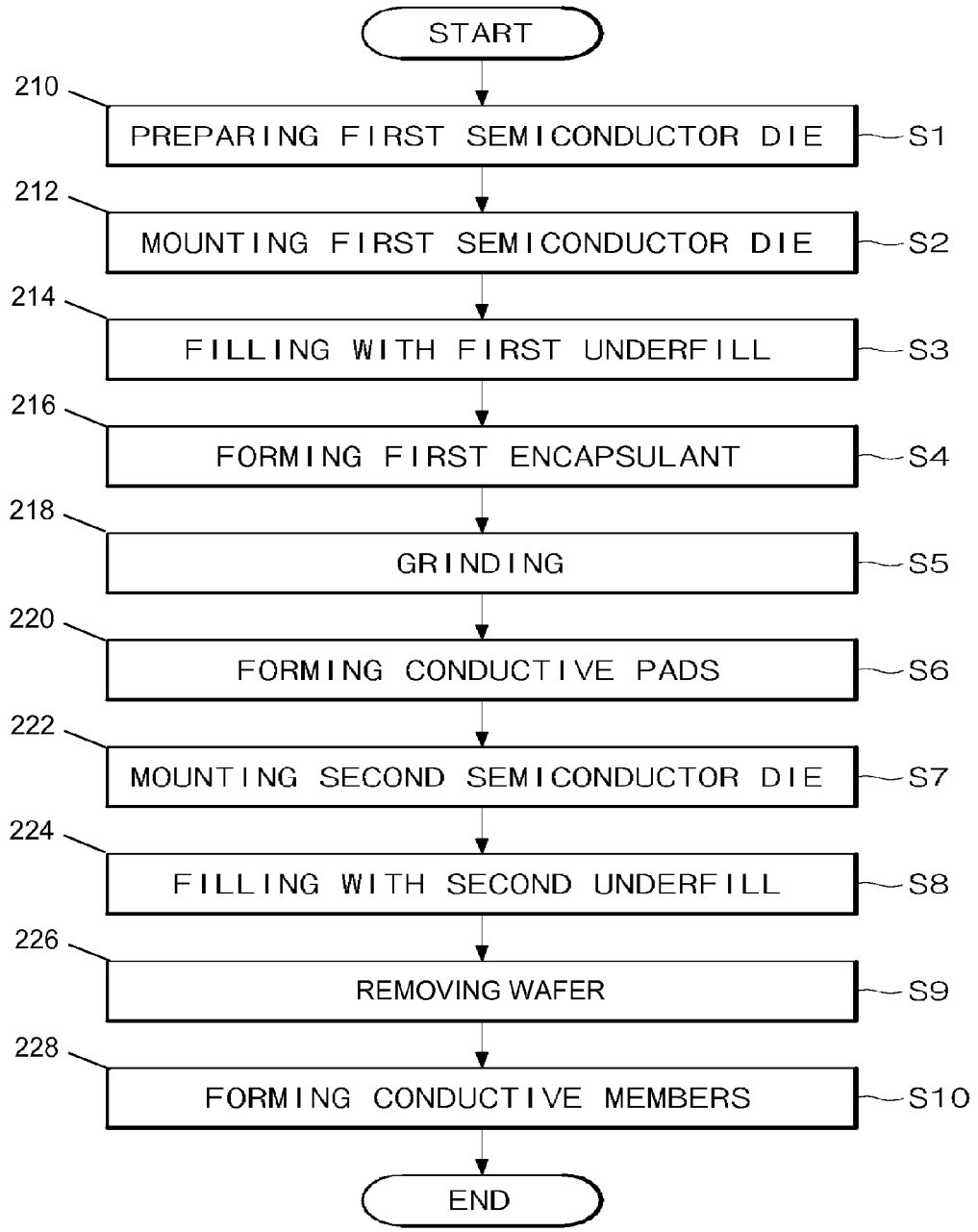
FIG. 2 is a flowchart illustrating an exemplary manufacturing method of the semiconductor device shown in FIG. 1, in accordance with a representative embodiment of the present disclosure.

FIG. 2 is a flowchart illustrating an exemplary manufacturing method of the semiconductor device shown in FIG. 1, in accordance with a representative embodiment of the present disclosure.

As illustrated in FIG. 2, the manufacturing method of the semiconductor device shown in FIG. 1 includes, at block 210 (S1), providing a first semiconductor die; at block 212 (S2), mounting the first semiconductor die; at block 214 (S3), filling with a first underfill; at block 216 (S4), forming a first encapsulant; at block 218 (S5), grinding; at block 220 (S6), forming conductive pads; at block 222 (S7), mounting a second semiconductor die; at block 224 (S8), filling with a second underfill; at block 226 (S9), removing a wafer; and at block 228 (S10), forming conductive members.

FIGS. 3A to 3J are cross-sectional views for explaining the exemplary manufacturing method of the semiconductor device shown in FIG. 2, in accordance with a representative embodiment of the present disclosure. The manufacturing method of the semiconductor device show in FIG. 2 will be described in detail with reference to FIGS. 3A to 3J.

Figure 3A:
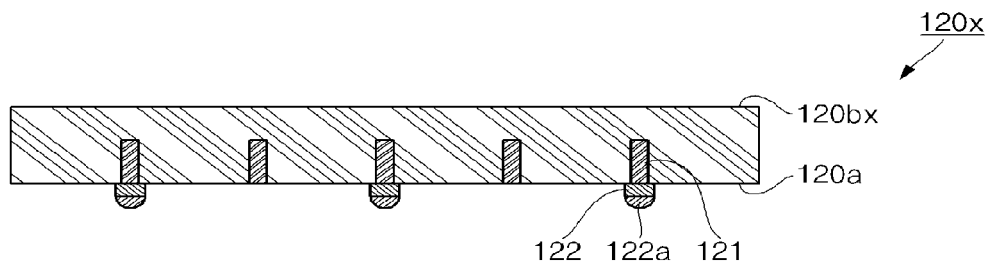
FIGS. 3A to 3J are cross-sectional views for explaining the exemplary manufacturing method of the semiconductor device shown in FIG. 2, in accordance with a representative embodiment of the present disclosure.

Referring now to FIG. 3A, a cross-sectional view illustrating step (S1) 210 of providing a first semiconductor die in the manufacturing method of the semiconductor device show in FIG. 2 is illustrated. In step (S1) 210, the first semiconductor die 120x is prepared, the first semiconductor die 120x having a first surface 120a that is substantially planar and a second surface 120bx opposite to the first surface 120a and including a plurality of through electrodes 121 exposed to the first surface 120a and a plurality of first conductive pillars 122 connected to through electrodes 121 exposed to the first surface 120a.

The through electrodes 121 may be formed in the first semiconductor die 120x so as to have a predetermined depth from the first surface 120a of the first semiconductor die 120x. The through electrodes 121 may not be exposed to the second surface 120bx of the first semiconductor die 120x. The through electrodes 121 may be formed by, by way of example, forming through holes in the first surface 120a of the first semiconductor die 120x and filling the through holes formed in the first surface 120a of the first semiconductor die 120x with a conductive material, but aspects of the present disclosure are not limited thereto.

After forming the through electrodes 121, the first conductive pillars 122 may be formed on the first surface 120a to be electrically connected to the through electrodes 121 exposed to the first surface 120a of the first semiconductor die 120x. In addition, the first conductive pillars 122 may be electrically connected to the conductive pattern 111 of the pattern layer 110 and may further include a solder cap 122a formed at an end of each of the first conductive pillars 122 to be easily electrically connected to the conductive pattern 111 of the pattern layer 110.

Figure 3B:
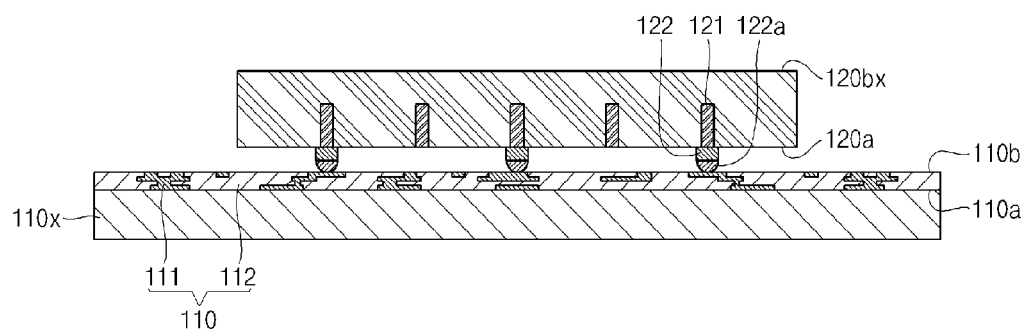

Referring now to FIG. 3B, a cross-sectional view illustrating step (S2) 212 of mounting the first semiconductor die in the manufacturing method of the semiconductor device show in FIG. 2 is illustrated. In step (S2) 212, the first semiconductor die 120 may be mounted on a wafer 110x having a pattern layer 110. In the illustration of FIG. 3B, the first conductive pillars 122 formed on the first surface 120a of the first semiconductor die 120 are connected to the pattern layer 110. The pattern layer 110 may be implemented on the wafer 110x in a semiconductor FAB process.

The pattern layer 110 of FIG. 3B includes a conductive pattern 111 and a dielectric layer 112. In a representative embodiment of the present disclosure, the pattern layer 110 may, for example, be configured such that a plurality of conductive patterns 111 formed on the wafer 110x as multiple layers having a line width in a range of 0.1 μm to 20 μm, and the dielectric layer 112 may, for example, be formed as multiple layers for electrically isolating the plurality of conductive patterns 111.

The first semiconductor die 120 may be mounted on the second surface 110b of the pattern layer 110 such that the first conductive pillars 122 are connected to the conductive pattern 111 of the pattern layer 110. The pattern layer 110 implemented on the wafer 110x in the semiconductor FAB process and including the conductive pattern 111 and the dielectric layer 112 may have a thickness in a range of 1 μm to 10 μm.

In addition, when the first semiconductor die 120 and the pattern layer 110 are moved between processing equipment during manufacturing of the semiconductor device 100, the wafer 110x may be used as a carrier for fixedly supporting and preventing the semiconductor device 100 from being damaged. That is to say, during the manufacturing of the semiconductor device 100, since the wafer 110x can be used as a carrier, it is not necessary to provide a separate carrier in order to transfer the first semiconductor die 120 to the processing equipment. In addition, damage that may be caused to the semiconductor device 100 by attaching a carrier and releasing the same may be avoided.

Figure 3C:
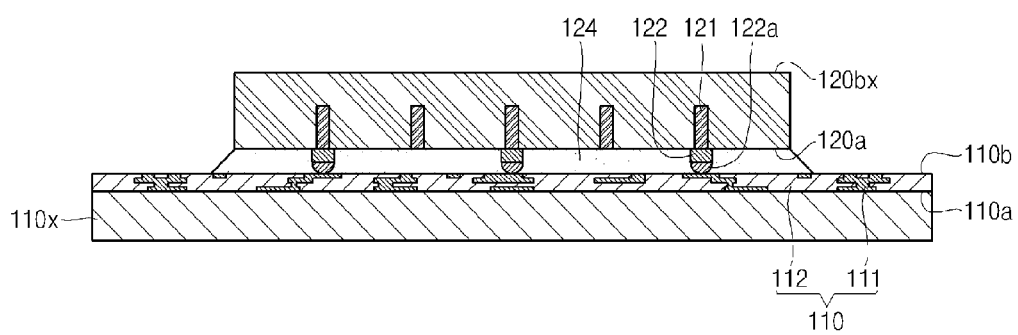

Referring now to FIG. 3C, a cross-sectional view illustrating step (S3) 214 of filling with a first underfill in the manufacturing method of the semiconductor device show in FIG. 2 is illustrated. In step (S3) 214, the first underfill 124 fills a gap between the first semiconductor die 120 and the pattern layer 110. The first underfill 124 fills the gap between the first surface 120a of the first semiconductor die 120 and the second surface 110*b* of the pattern layer 110, which face each other. In the example of FIG. 3C, the first underfill 124 is formed to encapsulate the first conductive pillars 122 of the first semiconductor die 120.

Figure 3D:
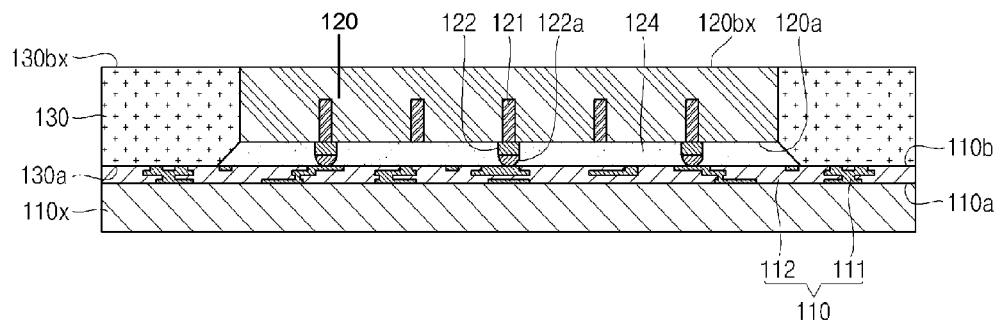

Referring now to FIG. 3D, a cross-sectional view illustrating step (S4) 216 of forming a first encapsulant in the manufacturing method of the semiconductor device show in FIG. 2 is illustrated. In step (S4) 216, the first semiconductor die 120 and the pattern layer 110 are encapsulated with the first encapsulant 130. The first encapsulant 130 encapsulates the first semiconductor die 120 connected to the second surface 110*b* of the pattern layer 110 to protect the first semiconductor die 120 from external environment factors. In a representative embodiment of the present disclosure, the first encapsulant 130 may encapsulate the second surface 110*b* of the pattern layer 110 and the first semiconductor die 120, and the second surface 120*bx* of the first semiconductor die 120 may be exposed from the first encapsulant 130 to the outside. A lateral surface of the first encapsulant 130 may be formed on the same plane with a lateral surface of the pattern layer 110, the first surface 130*a* comes into contact with the second surface 110*b* of the pattern layer 110, and the second surface 130*bx* may be formed on the same plane with the second surface 120*bx* of the first semiconductor die 120 or may entirely cover the first semiconductor die 120.

Figure 3E:
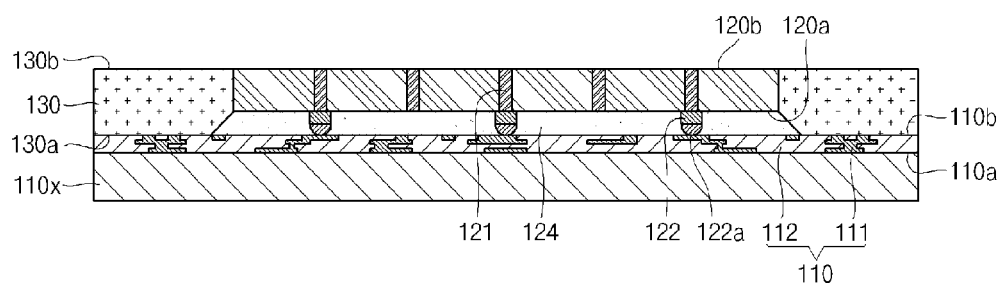

Referring now to FIG. 3E, a cross-sectional view illustrating step (S5) 218 of grinding in the manufacturing method of the semiconductor device show in FIG. 2 is illustrated. In step (S5) 218, the second surface 120*b* of the first semiconductor die 120 is subjected to grinding, thereby exposing the through electrodes 121 to the outside through the second surface 120*b* of the first semiconductor die 120. In step (S5) 218, the second surface 130*b* of the first encapsulant 130 may also be subjected to grinding together with the first semiconductor die 120, so that the second surface 120*b* of the first semiconductor die 120 and the second surface 130*b* of the first encapsulant 130 form on the same plane. That is to say, in step (S5) 218, the second surface 120*b* of the first semiconductor die 120 and the first encapsulant 130 may be subjected to grinding, thereby exposing the through electrodes 121 to the outside through the second surface 120*b* of the first semiconductor die 120. The grinding may be performed using, for example, a diamond grinder or an equivalent thereof, but not limited thereto.

Figure 3F:
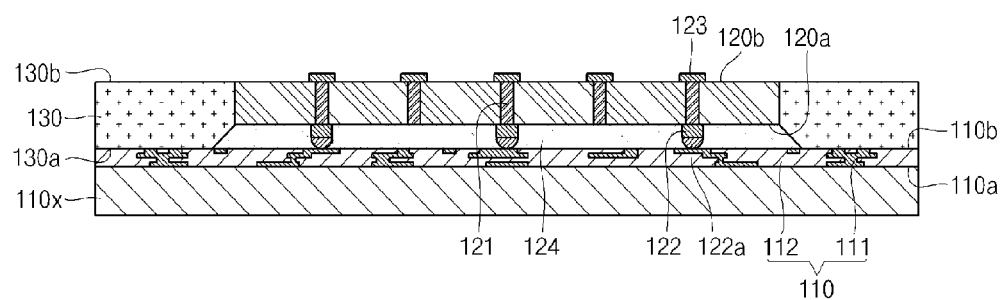

Referring now to FIG. 3F, a cross-sectional view illustrating step (S6) 220 of forming conductive pads in the manufacturing method of the semiconductor device show in FIG. 2 is illustrated. In step (S6) 220, conductive pads 123 may be formed on the second surface 120*b* of the first semiconductor die 120 to be electrically connected to the through electrodes 121 exposed through the second surface 120*b* of the first semiconductor die 120. The conductive pads 123 may, by way of example, be made of nickel (Ni), gold (Au), or an equivalent thereof, but not limited thereto. The conductive pads 123 may be formed, by way of example, by sputtering, vacuum deposition, or photolithography, but not limited thereto.

Figure 3G:
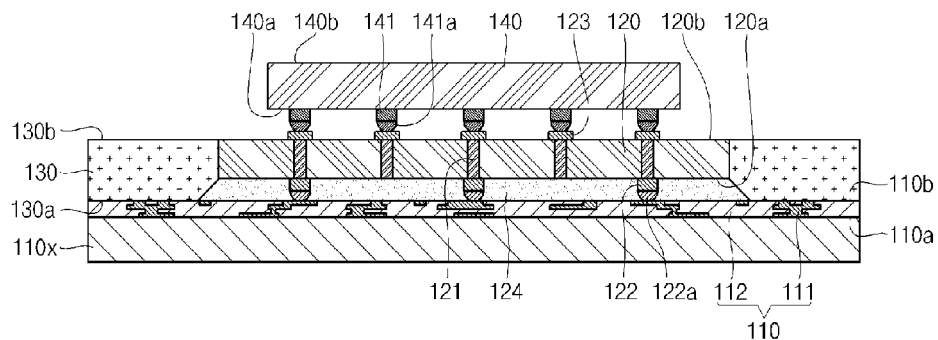

Referring now to FIG. 3G, a cross-sectional view illustrating step (S7) 222 of mounting a second semiconductor die in the manufacturing method of the semiconductor device show in FIG. 2 is illustrated. In step (S7) 222, the second semiconductor die 140 having the second conductive pillars 141 may be mounted on the second surface 120*b* of the first semiconductor die 120. As shown in the example, of FIG. 3G, the second conductive pillars 141 formed on the first surface 140*a* of the second semiconductor die 140 are electrically connected to the conductive pads 123 formed on the second surface 120*b* of the first semiconductor die 120. In addition, the first surface 120*a* of the first semiconductor die 120 and the second surface 120*b* of the first semiconductor die 120 face each other. Each of the second conductive pillars 141 of the second semiconductor die 140 may have a solder cap 141*a* formed at its end to be easily connected to the conductive pads 123.

Figure 3H:
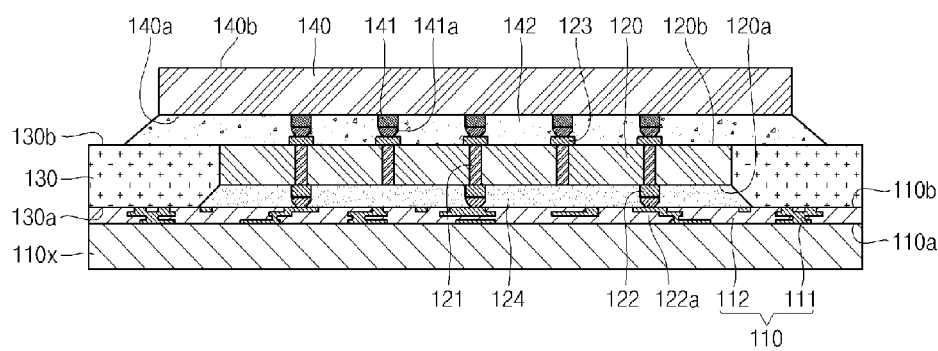

Referring now to FIG. 3H, a cross-sectional view illustrating step (S8) 224 of filling with a second underfill in the manufacturing method of the semiconductor device show in FIG. 2 is illustrated. In step (S8) 224, the second underfill 142 fills a gap between the second semiconductor die 140 and the first semiconductor die 120. The second underfill 142 fills the gap between the first surface 140*a* of the second semiconductor die 140 and the second surface 120*b* of the first semiconductor die 120. In the example of FIG. 3H, the second underfill 142 is formed to encapsulate the second conductive pillars 141 of the second semiconductor die 140.

Figure 3I:
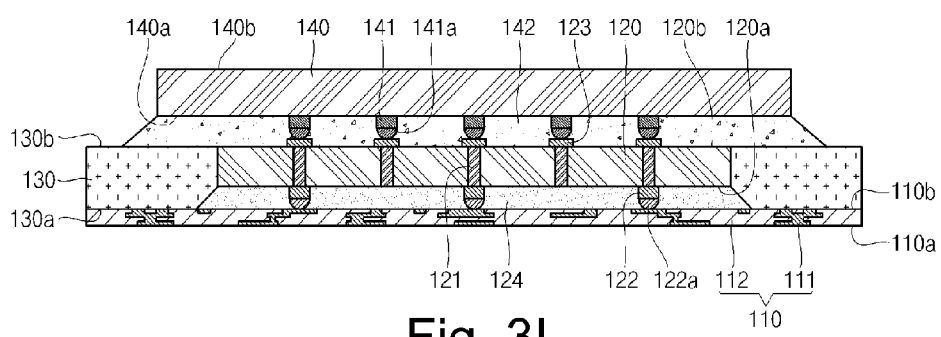

Referring now to FIG. 3I, a cross-sectional view illustrating step (S9) 226 of removing a wafer in the manufacturing method of the semiconductor device show in FIG. 2 is illustrated. In step (S9) 226, the wafer 110*x* of FIG. 3H, opposite to a surface on which the pattern layer 110 is formed, may be subjected to grinding and etching, thereby exposing the first surface 110*a* of the pattern layer 110 to the outside. In the example of FIG. 3I, the conductive pattern 111 of the pattern layer 110 is exposed to the outside through the first surface 110*a* of the pattern layer 110. In addition, in step (S9) 226, the wafer 110*x* of FIG. 3H may be removed by grinding, and a silicon (Si) component remaining on the first surface 110*a* of the pattern layer 110 may then be etched for removal. The grinding may be performed using, for example, a diamond grinder or an equivalent thereof, but not limited thereto. The etching may, for example, be wet etching or dry etching, but is not limited thereto.

Figure 3J:
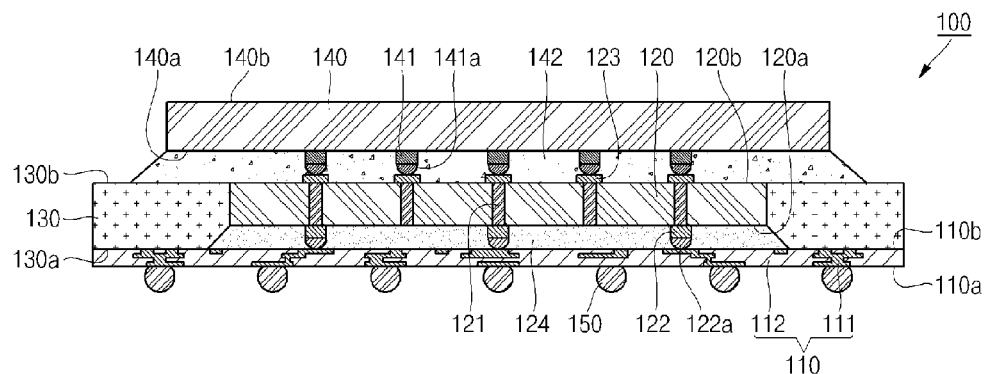

Referring now to FIG. 3J, a cross-sectional view illustrating step (S10) 228 of forming conductive members in the manufacturing method of the semiconductor device show in FIG. 2 is illustrated. In step (S10) 228, solder balls as the conductive members 150 may be formed on the second surface 110*b* of the pattern layer 110. The solder balls as the conductive members 150 are thereby electrically connected to the conductive pattern 111 of the pattern layer 110. After step (S10) 228, singulation (not shown) may further be performed for dicing the pattern layer 110 having the first semiconductor die 120 and the second semiconductor die 140 stacked thereon and singulating individual semiconductor devices 100.

Figure 4:
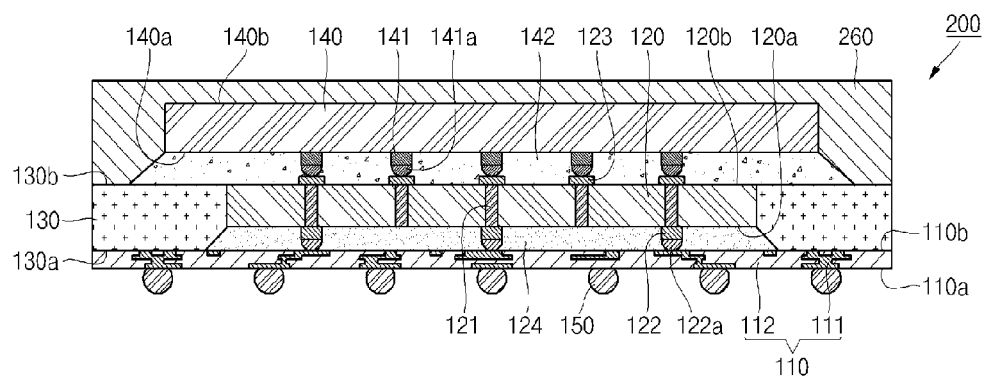
FIG. 4 is a cross-sectional view of an exemplary semiconductor device, in accordance with another representative embodiment of the present disclosure.

FIG. 4 is a cross-sectional view of an exemplary semiconductor device, in accordance with another representative embodiment of the present disclosure.

As illustrated in FIG. 4, the semiconductor device 200 includes a pattern layer 110, a first semiconductor die 120 having a plurality of through electrodes 121 and first conductive pillars 122 formed therein, a first encapsulant 130 encapsulating the first semiconductor die 120, a second semiconductor die 140 having second conductive pillars 141, a plurality of conductive members 150 formed on the pattern layer 110, and a second encapsulant 260 encapsulating the second semiconductor die 140.

As illustrated in FIG. 4, configurations of the pattern layer 110, the first semiconductor die 120, the first encapsulant 130, the second semiconductor die 140, and the conductive members 150 of the semiconductor device 200 may be the same as those of respectively corresponding components of the semiconductor device 100 shown in FIG. 1. Therefore, the following description of the semiconductor device 200 will focus on the second encapsulant 260, which may be a different feature from the semiconductor device 100 shown in FIG. 1.

In a representative embodiment of the present disclosure, the second encapsulant 260 may encapsulate the second semiconductor die 140 to entirely cover the second semiconductor die 140. For example, the second encapsulant 260 may be formed to cover both of the second surface 130b of the first encapsulant 130 and the second semiconductor die 140 and may protect the second semiconductor die 140 from external environment factors. The second encapsulant 260 may be, by way of example and not limitation, made of an epoxy-based resin that is an electrically insulating material.

Figure 5:
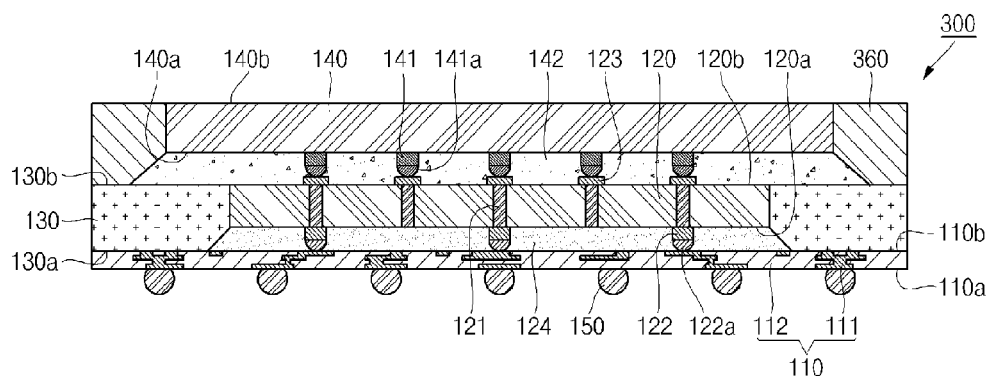
FIG. 5 is a cross-sectional view of an exemplary semiconductor device, in accordance with still another representative embodiment of the present disclosure.

FIG. 5 is a cross-sectional view of an exemplary semiconductor device, in accordance with still another representative embodiment of the present disclosure.

As illustrated in FIG. 5, the semiconductor device 300 includes a pattern layer 110, a first semiconductor die 120 having a plurality of through electrodes 121 and first conductive pillars 122, a first encapsulant 130 encapsulating the first semiconductor die 120, a second semiconductor die 140 having second conductive pillars 141, a plurality of conductive members 150 formed on the pattern layer 110, and a second encapsulant 360 encapsulating the second semiconductor die 140.

As shown in FIG. 5, configurations of the pattern layer 110, the first semiconductor die 120, the first encapsulant 130, the second semiconductor die 140, and the conductive members 150 of the semiconductor device 300 may be the same as those of respectively corresponding components of the semiconductor device 100 shown in FIG. 1. Therefore, the following description of the semiconductor device 300 will focus on the second encapsulant 360, which is a different feature from the semiconductor device 100 shown in FIG. 1.

In a representative embodiment of the present disclosure, the second encapsulant 360 may encapsulate the second semiconductor die 140. The second encapsulant 360 may be formed to cover both of the second surface 130b of the first encapsulant 130 and the second semiconductor die 140, and may expose a second surface 140b of the second semiconductor die 140 to the outside. The second encapsulant 360 may be formed such that it is formed on both of the second surface 130b of the first encapsulant 130 and the second semiconductor die 140 and may then be subjected to grinding to expose the second surface 140b of the second semiconductor die 140 to the outside. Since the second surface 140b of the second semiconductor die 140 may then be exposed to the outside of the second encapsulant 360, the semiconductor device 300 can easily dissipate heat. The second encapsulant 360 may be made of, by way of example and not limitation, an epoxy-based resin that is an electrically insulating material.

Figure 6:
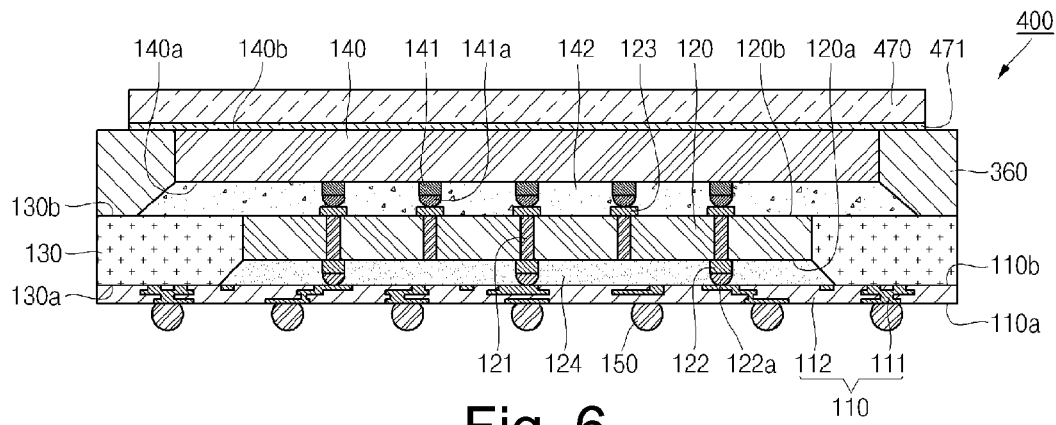
FIG. 6 is a cross-sectional view of an exemplary semiconductor device, in accordance with yet another representative embodiment of the present disclosure.

FIG. 6 is a cross-sectional view of an exemplary semiconductor device, in accordance with yet another representative embodiment of the present disclosure.

As illustrated in FIG. 6, the semiconductor device 400 includes a pattern layer 110, a first semiconductor die 120 having a plurality of through electrodes 121 and first conductive pillars 122, a first encapsulant 130 encapsulating the first semiconductor die 120, a second semiconductor die 140 having second conductive pillars 141, conductive members 150 formed on the pattern layer 110, a second encapsulant 360 encapsulating the second semiconductor die 140, and a cover 470 attached to a second surface 140b of the second semiconductor die 140.

As shown in the example of FIG. 6, configurations of the pattern layer 110, the first semiconductor die 120, the first encapsulant 130, the second semiconductor die 140, the conductive members 150 of the semiconductor device 300, and the second encapsulant 360 may be the same as those of respectively corresponding components of the semiconductor device 300 shown in FIG. 5. Therefore, the following description of the semiconductor device 300 will focus on the cover 470, which is a different feature from the semiconductor device 300 shown in FIG. 5.

As shown in the example of FIG. 6, the cover 470 may be attached to the second surface 140b of the second semiconductor die 140 exposed to the outside of the second encapsulant 360. The cover 470 may be attached to the second surface 140b of the second semiconductor die 140 using, by way of example and not limitation, a thermally conductive adhesive 471. The cover 470 may protect the second surface 140b of the second semiconductor die 140 from external environment factors. In order to improve dissipating performance, the cover 470 may be made of, by way of example, copper (Cu), aluminum (Al), or an equivalent thereof, but not limited thereto.

Figure 7:
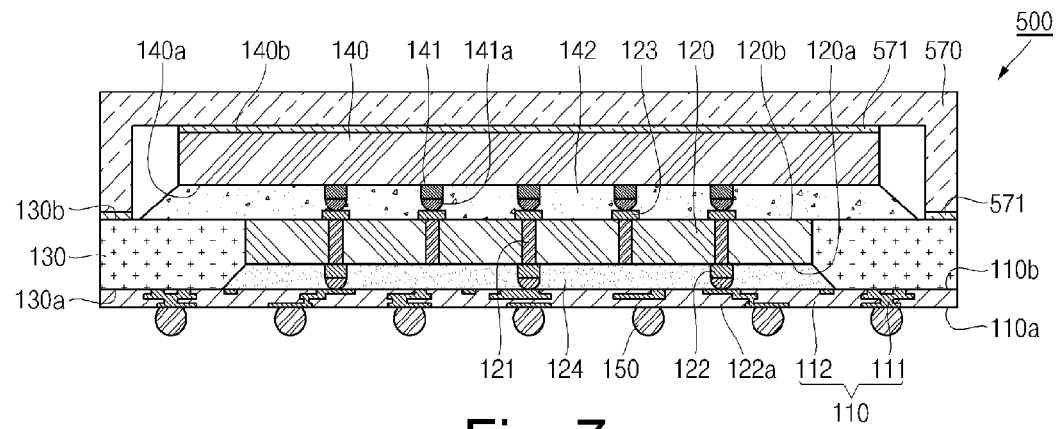
FIG. 7 is a cross-sectional view of an exemplary semiconductor device, in accordance with a further representative embodiment of the present disclosure.

FIG. 7 is a cross-sectional view of an exemplary semiconductor device, in accordance with a further representative embodiment of the present disclosure.

As illustrated in FIG. 7, the exemplary semiconductor device 500 includes a pattern layer 110, a first semiconductor die 120 having a plurality of through electrodes 121 and first conductive pillars 122, a first encapsulant 130 encapsulating the first semiconductor die 120, a second semiconductor die 140 having second conductive pillars 141, a plurality of conductive members 150 formed on the pattern layer 110, and a cover 570 attached to a second surface 140b of the second semiconductor die 140.

As shown in the example of FIG. 7, configurations of the pattern layer 110, the first semiconductor die 120, the first encapsulant 130, the second semiconductor die 140, and the conductive members 150 of the semiconductor device 500 may be the same as those of respectively corresponding components of the semiconductor device 100 shown in FIG. 1. Therefore, the following description of the semiconductor device 500 will focus on the cover 570, which is a different feature from the semiconductor device 100 shown in FIG. 1.

In a representative embodiment of the present disclosure, the cover 570 may be attached to the second surface 140b of the second semiconductor die 140 and a second surface 130b of the first encapsulant 130, to encapsulate the second semiconductor die 140. The cover 570 may be attached to the second surface 140b of the second semiconductor die 140 and the second surface 130b of the first encapsulant 130, using, by way of example, a thermally conductive adhesive 571, but not limited thereto. The cover 570 protects the second semiconductor die 140 from external environment factors. In order to improve dissipating performance, the cover 570 may be made of, by way of example, copper (Cu), aluminum (Al), or an equivalent thereof, but not limited thereto.

Figure 8:
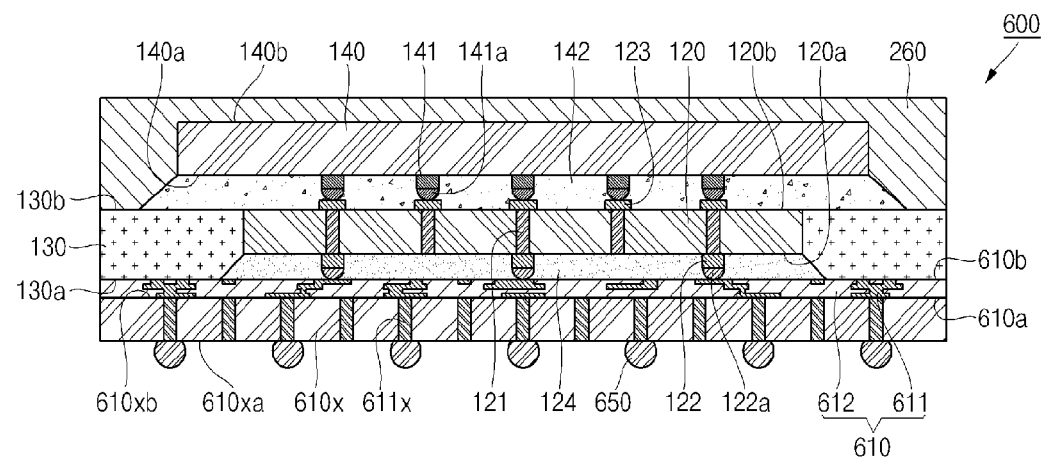
FIG. 8 is a cross-sectional view of an exemplary semiconductor device, in accordance with another representative embodiment of the present disclosure.

FIG. 8 is a cross-sectional view of an exemplary semiconductor device, in accordance with another representative embodiment of the present disclosure.

As illustrated in FIG. 8, the exemplary semiconductor device 600 includes a wafer 610x having a pattern layer 610, a first semiconductor die 120 having a plurality of through electrodes 121 and first conductive pillars 122, a first encapsulant 130 encapsulating the first semiconductor die 120, a second semiconductor die 140 having second conductive pillars 141, a plurality of conductive members 650 formed on the wafer 610x, and a second encapsulant 260 encapsulating the second semiconductor die 140.

As shown in the example of FIG. 8, configurations of the first semiconductor die 120, the first encapsulant 130, the second semiconductor die 140, and the second encapsulant 260 of the semiconductor device 600 may be the same as those of respectively corresponding components of the semiconductor device 200 shown in FIG. 4. Therefore, the following description of the semiconductor device 600 will focus on the wafer 610x and the conductive members 650, which are different features from the semiconductor device 200 shown in FIG. 4.

In the example of FIG. 8, the wafer 610x has a first surface 610xa, and a second surface 610xb opposite to the first surface 610xa and having the pattern layer 610 formed thereon. The wafer 610x includes wafer through electrodes 611x passing through a region between the first surface 610xa and the second surface 610xb. That is to say, the wafer through electrodes 611x of the wafer 610x are exposed to the outside through the first and second surfaces 610xa, 610xb of the wafer 610x, respectively. The pattern layer 610 includes a conductive pattern 611 and a dielectric layer 612. In detail, the pattern layer 610 is configured such that a plurality of conductive patterns 611 may be formed on the wafer 610x as multiple layers so as to have a line width in a range of 0.1 to 20 μm, and the dielectric layer 612 may be formed as multiple layers for electrically isolating the plurality of conductive patterns 611.

The pattern layer 610 may be implemented on the wafer 610x in a semiconductor FAB process and may have a thickness in a range of 1 to 10 μm.

As illustrated in FIG. 8, conductive patterns 611 of the pattern layer 110 are electrically connected to the through electrodes 611x exposed to the second surface 610xb of the wafer 610x.

As shown in the example of FIG. 8, the conductive members 650 are electrically connected to the first surface 610xa opposite to the second surface 610xb having the pattern layer 610 on the wafer 610x. The conductive members 650 may be solder balls that are solder in a ball shape. In the example of FIG. 8, the conductive members 650 are electrically connected to the through electrodes 611x exposed to the first surface 610xa of the wafer 610x. The solder balls as the conductive members 650 allow a semiconductor device such as the semiconductor device 600 according to the present disclosure to be mounted on, by way of example and not limitation, a mother board or a main board of an electronic device, such as a computer or a smart phone, for example.

Figure 9:
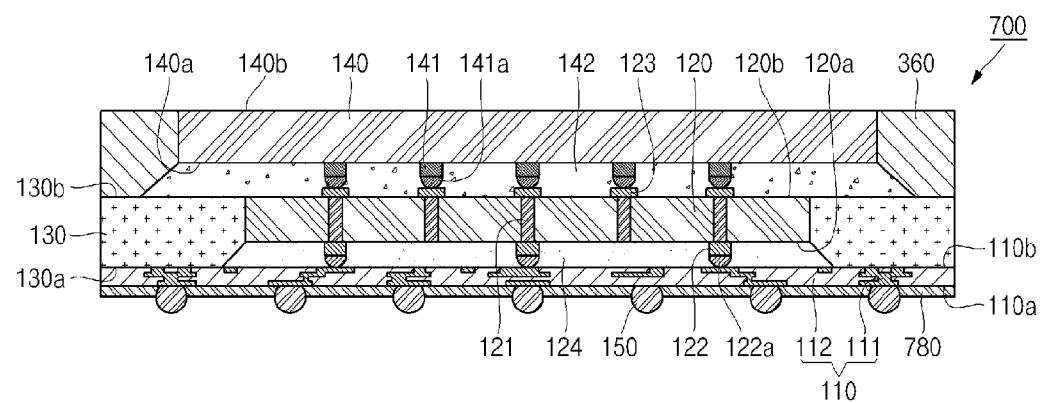
FIG. 9 is a cross-sectional view of an exemplary semiconductor device, in accordance with still another representative embodiment of the present disclosure.

FIG. 9 is a cross-sectional view of an exemplary semiconductor device, in accordance with still another representative embodiment of the present disclosure.

As illustrated in the example of FIG. 9, the semiconductor device 700 includes a pattern layer 110, a first semiconductor die 120 having a plurality of through electrodes 121 and first conductive pillars 122, a first encapsulant 130 encapsulating the first semiconductor die 120, a second semiconductor die 140 having second conductive pillars 141, a plurality of conductive members 150 formed on the pattern layer 110, a second encapsulant 360 encapsulating the second semiconductor die 140, and a third encapsulant 780 encapsulating a first surface 110a of the pattern layer 110.

As illustrated in the example of FIG. 9, configurations of the pattern layer 110, the first semiconductor die 120, the first encapsulant 130, the second semiconductor die 140, the conductive members 150, and the second encapsulant 360 of the semiconductor device 700 may be the same as those of respectively corresponding components of the semiconductor device 300 shown in FIG. 5. Therefore, the following description of the semiconductor device 700 will focus on the third encapsulant 780, which is a different feature from the semiconductor device 300 shown in FIG. 5.

In a representative embodiment of the present disclosure, the third encapsulant 780 may encapsulate the first surface 110a of the pattern layer 110. As shown in FIG. 9, the third encapsulant 780 may be formed to cover the first surface 110a of the pattern layer 110 and may expose the conductive members 150 to the outside. The third encapsulant 780 may be formed to cover the first surface 110a of the pattern layer 110 after forming of the conductive members 150 to be connected to the first surface 110a of the pattern layer 110. The third encapsulant 780 may protect the first surface 110a of the pattern layer 110 having the conductive members 150 from external environment factors. The third encapsulant 780 may be made of, by way of example and not limitation, an epoxy-based resin that is an electrically insulating material.

Figure 10:
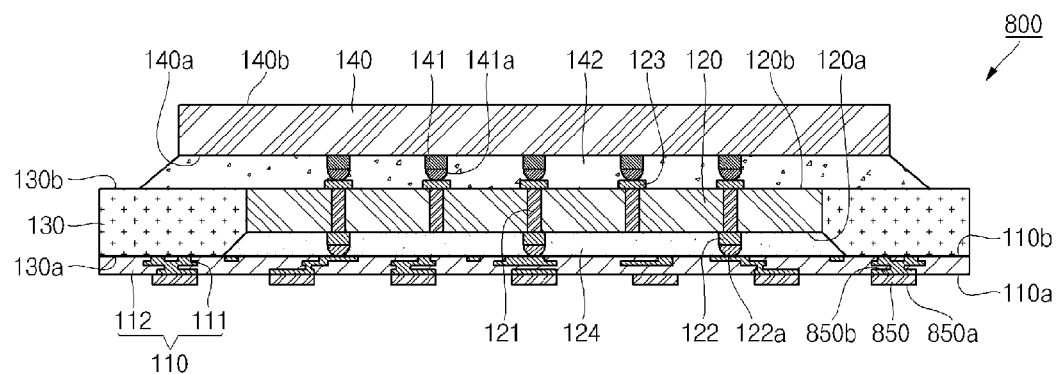
FIG. 10 is a cross-sectional view of an exemplary semiconductor device, in accordance with a further representative embodiment of the present disclosure.

FIG. 10 is a cross-sectional view of an exemplary semiconductor device, in accordance with a further representative embodiment of the present disclosure.

As illustrated in the example of FIG. 10, the semiconductor device 800 includes a pattern layer 110, a first semiconductor die 120 having a plurality of through electrodes 121 and first conductive pillars 122, a first encapsulant 130 encapsulating the first semiconductor die 120, a second semiconductor die 140 having second conductive pillars 141, and a plurality of conductive members 850 formed on the pattern layer 110.

In a representative embodiment of the present disclosure, configurations of the pattern layer 110, the first semiconductor die 120, the first encapsulant 130, and the second semiconductor die 140 of the semiconductor device 800 may be the same as those of respectively corresponding components of the semiconductor device 100 shown in FIG. 1. Therefore, the following description of the semiconductor device 800 will focus on the conductive members 850, which are a different feature from the semiconductor device 100 shown in FIG. 1.

As shown in FIG. 10, the conductive members 850 are connected to a conductive pattern 111 exposed to a first surface 110a of the pattern layer 110. The conductive members 850 are illustrated as lands outwardly protruding from the first surface 110a of the pattern layer 110 and are made of a conductive metal. The conductive members 850 of FIG. 10 are configured such that a first surface 850a outwardly protrudes from the first surface 110a of the pattern layer 110, and a second surface 810b is connected to the first surface 110a of the pattern layer 110. The lands as the conductive members 850 allow a semiconductor device such as the semiconductor device 800 according to the present disclosure to be mounted on, by way of example and not limitation, a mother board or a main board of an electronic device, such as a computer or a smart phone, for example.

Figure 11:
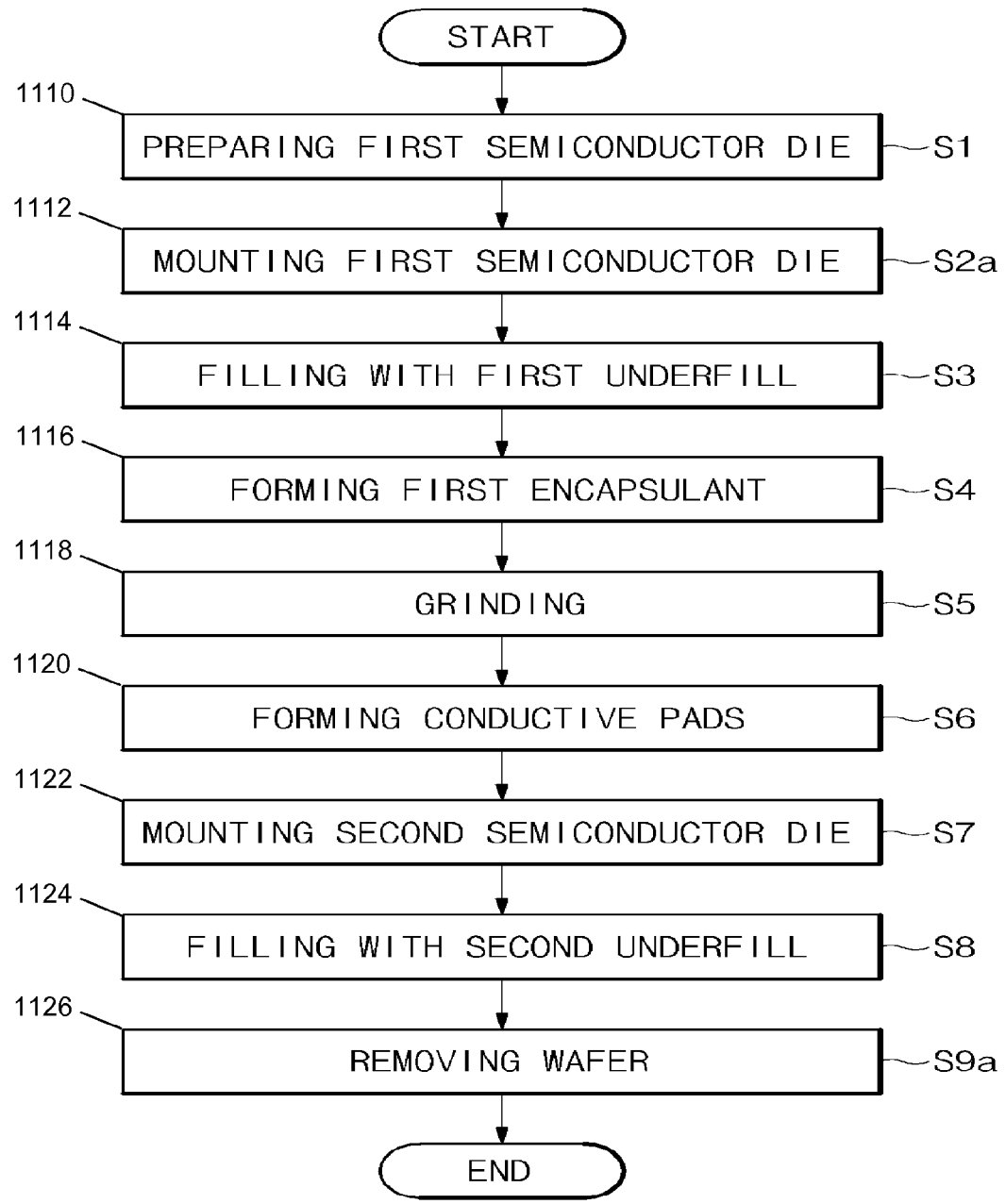
FIG. 11 is a flowchart illustrating an exemplary method of manufacturing the semiconductor device shown in FIG. 10, in accordance with a representative embodiment of the present disclosure.

FIG. 11 is a flowchart illustrating an exemplary method of manufacturing the semiconductor device shown in FIG. 10, in accordance with a representative embodiment of the present disclosure.

As illustrated in FIG. 11, the manufacturing method of the semiconductor device includes a step (S1) 1110, of providing a first semiconductor die; a step (S2a) 1112, of mounting the first semiconductor die; a step (S3) 1114, of filling with a first underfill; a step (S4) 1116, of forming a first encapsulant; a step (S5) 1118, of grinding; a step (S6) 1120, of forming conductive pads; a step (S7) 1122, of mounting a second semiconductor die, a step (S8) 1124, of filling with a second underfill, and a step (S9a) 1126, of removing a wafer.

The manufacturing method of the semiconductor device shown in FIG. 11 will now be described in more detail with reference to FIGS. 12A to 12I.

Figure 12A:
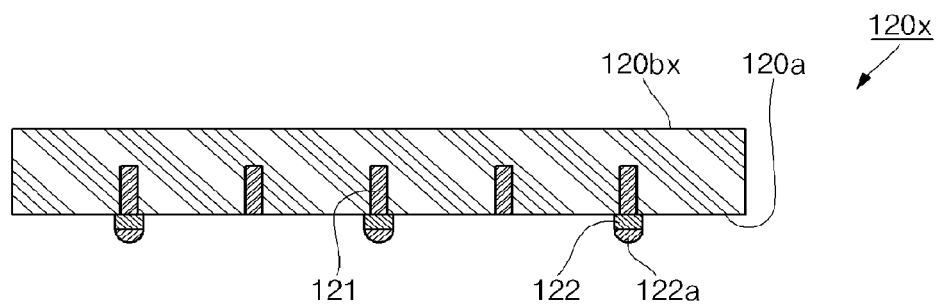
FIGS. 12A to 12I are cross-sectional views for explaining the exemplary method of manufacturing the semiconductor device shown in FIG. 11, in accordance with a representative embodiment of the present disclosure.

Referring now to FIG. 12A, a cross-sectional view illustrating step (S1) 1110 of providing a first semiconductor die in the manufacturing method of the semiconductor device 800 is illustrated. Here, step (S1) 1110 may be the same as step (S1) 210 of FIG. 2, of providing the first semiconductor die of the semiconductor device 100 shown in FIG. 3A.

Figure 12B:
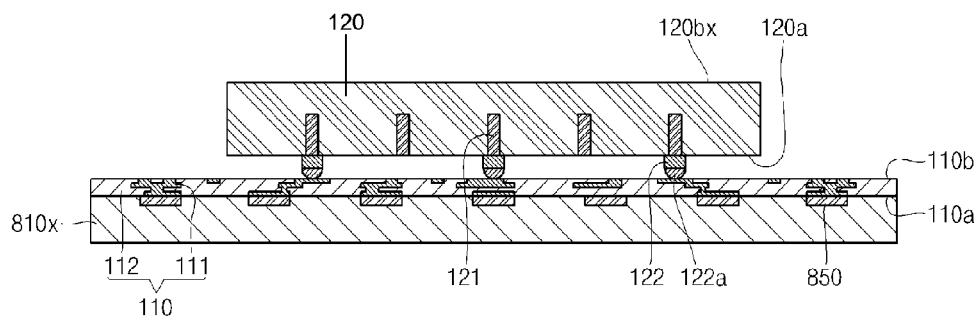
Figure 12C:
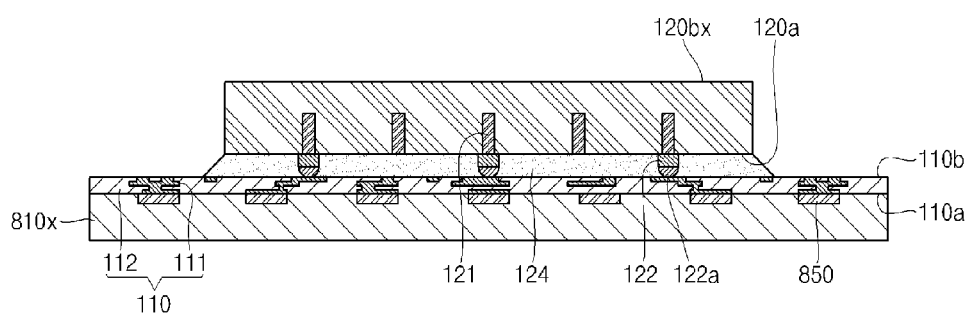
Figure 12D:
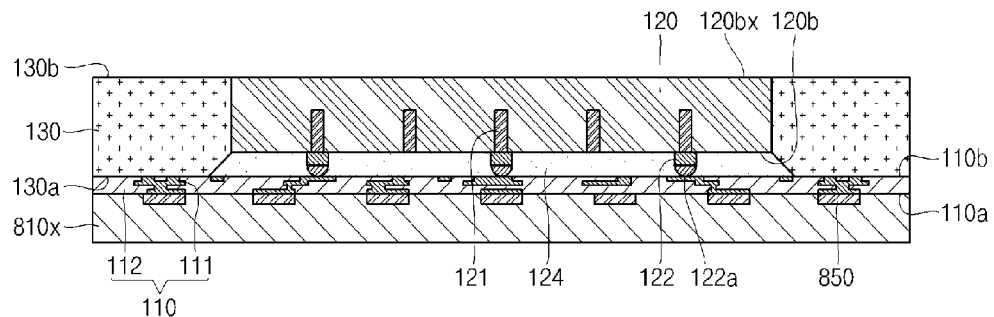
Figure 12E:
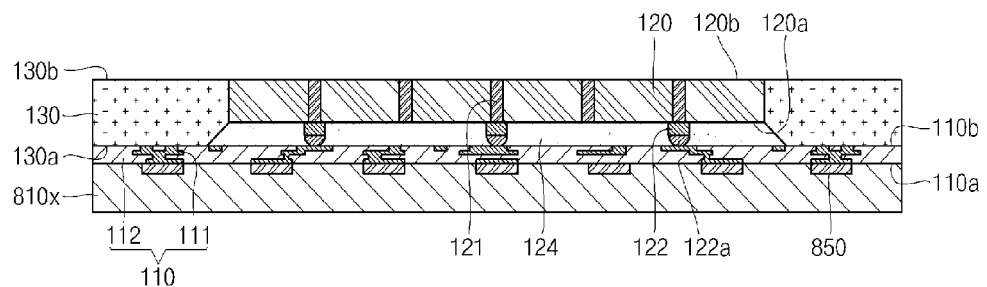
Figure 12F:
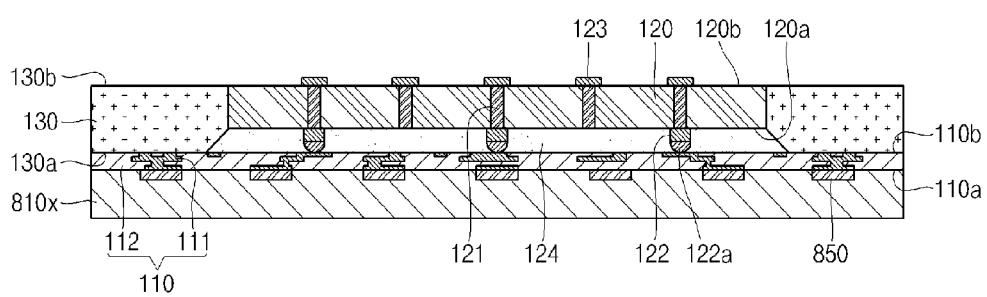
Figure 12G:
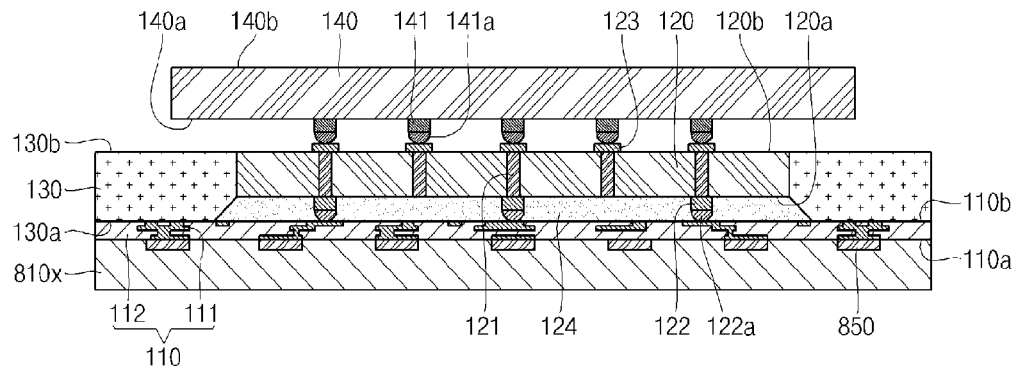
Figure 12H:
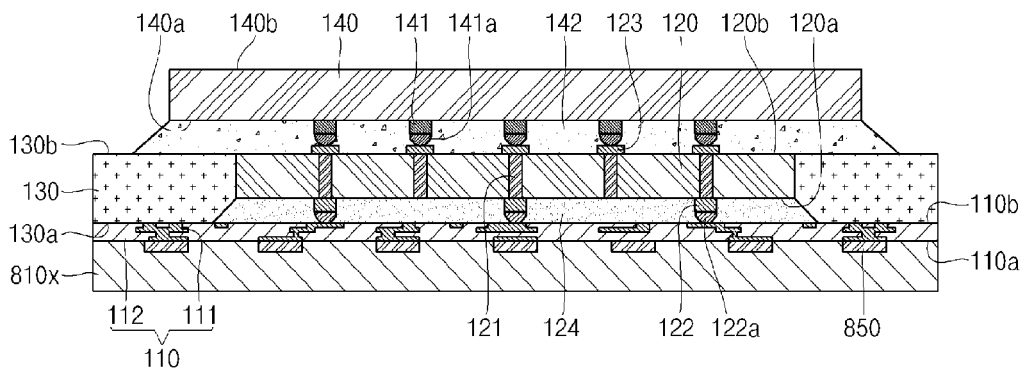

Referring now to FIG. 12B, a cross-sectional view illustrating step (S2a) 1112 of mounting the first semiconductor die in the manufacturing method of the semiconductor device 800 is illustrated. In step (S2a) 1112, the first semiconductor die 120 of FIG. 12B is mounted on a wafer 810x having a pattern layer 110 and lands as the conductive members 850.

As shown in FIG. 12B, the pattern layer 110 includes a conductive pattern 111 and a dielectric layer 112. The pattern layer 110 is configured such that the conductive pattern 111 exposed to the second surface 110b is electrically connected to the first conductive pillars 122 of the first semiconductor die 120. In addition, the pattern layer 110 is also configured such that the conductive pattern 111 exposed to the first surface 110a is electrically connected to the conductive members 850. The pattern layer 110 may, for example, be implemented on the wafer 810x in a semiconductor FAB process.

Before the pattern layer 110 is implemented on the wafer 810x, the conductive members 850 are formed inside the wafer 810x. The lands as the conductive members 850 may be formed by forming via holes having a predetermined depth by performing inward etching on a surface of the wafer 810x and filling the via holes with a metal. The pattern layer 110 is formed to cover the surface of the wafer 810x having the conductive members 850. In the example of FIG. 12B, conductive patterns 111 of the pattern layer 110 are electrically connected to a second surface 850b of the conductive members 850. The conductive members 850 may be electrically connected to the first semiconductor die 120 through the conductive patterns 111 of the pattern layer 110.

Referring now to FIGS. 12C to 12H, cross-sectional views illustrating step (S3) 1114 of filling with a first underfill, step (S4) 1116 of forming a first encapsulant, step (S5) 1118 of grinding, step (S6) 1120 of forming conductive pads, step (S7) 1122 of mounting a second semiconductor die, and step (S8) 1124 of filling with a second underfill in the manufacturing method of the semiconductor device 800 are illustrated, respectively. In the manufacturing method of the semiconductor device 800, step (S3) 1114 of filling with a first underfill, step (S4) 1116 of forming a first encapsulant, step (S5) 1118 of grinding, step (S6) 1120 of forming conductive pads, step (S7) 1122 of mounting a second semiconductor die, and step (S8) 1122 of filling with a second underfill may be the same as those of respectively corresponding steps of the manufacturing method of the semiconductor device 100 shown in FIGS. 3C to 3H.

Figure 12I:
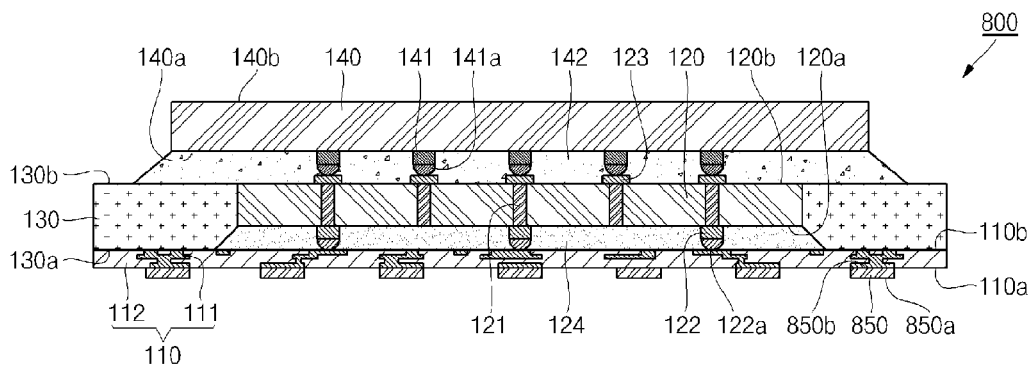

Referring now to FIG. 12I, a cross-sectional view illustrating step (S9a) 1126 of removing the wafer in the manufacturing method of the semiconductor device 800 is illustrated. In step S9a 1126, the wafer 810x (shown in FIG. 12H) opposite to the surface having the pattern layer 110 may be subjected to grinding and etching to expose the conductive members 850 to the outside. The grinding may be performed using, for example, a diamond grinder or an equivalent thereof, but not limited thereto. The etching may, for example, be wet etching or dry etching, but not limited thereto.

In addition, in step S9a 1126, the wafer 810x (shown in FIG. 12H) may be removed by grinding, and a silicon (Si) component remaining on the first surface 110a of the pattern layer 110 may then be etched for removal. In a representative embodiment of the present disclosure, the wafer 810x may be removed through grinding and etching, and the first surface 110a of the pattern layer 110 may then be exposed to the outside. After the remaining wafer 810x is removed, the conductive members 850 connected to the first surface 110a of the pattern layer 110 protrude from the first surface 110a of the pattern layer 110 while exposing a first surface 850a of each of the conductive members 850 to the outside. As shown in the example of FIG. 12I, the conductive members 850 may protrude from the first surface 110a of the pattern layer 110 as much as, for example, the thicknesses of the lands.

Figure 13:
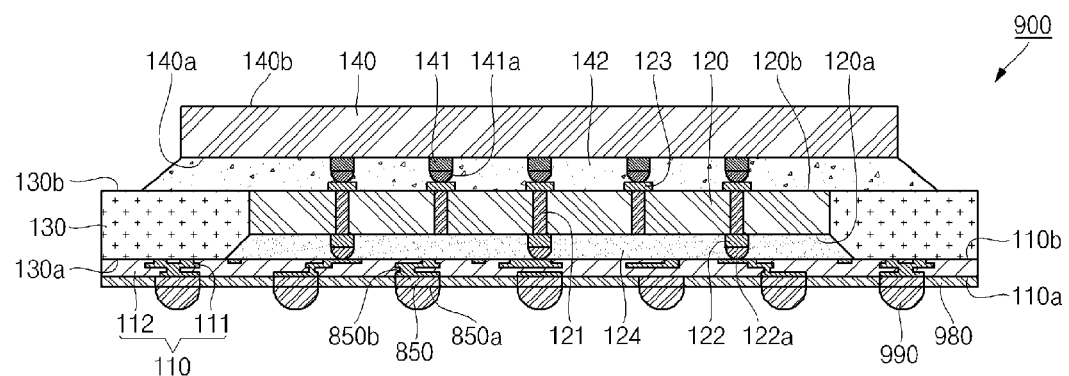
FIG. 13 is a cross-sectional view of an exemplary semiconductor device, in accordance with another representative embodiment of the present disclosure.

FIG. 13 is a cross-sectional view of an exemplary semiconductor device, in accordance with another representative embodiment of the present disclosure.

As illustrated in FIG. 13, the exemplary semiconductor device 900 includes a pattern layer 110, a first semiconductor die 120 having a plurality of through electrodes 121 and first conductive pillars 122, a first encapsulant 130 encapsulating the first semiconductor die 120, a second semiconductor die 140 having second conductive pillars 141, a plurality of conductive members 850 formed on the pattern layer 110, a third encapsulant 980 encapsulating a first surface 110a of the pattern layer 110, and solder balls 990 connected to the conductive members 850.

As illustrated in FIG. 13, configurations of the pattern layer 110, the first semiconductor die 120, the first encapsulant 130, the second semiconductor die 140, and the conductive members 850 of the semiconductor device 900 may be the same as those of respectively corresponding components of the semiconductor device 800 shown in FIG. 10. Therefore, the following description of the semiconductor device 900 will focus on the third encapsulant 980 and the solder balls 990, which are different features from the semiconductor device 800 shown in FIG. 10.

In a representative embodiment of the present disclosure, the third encapsulant 980 may encapsulate the first surface 110a of the pattern layer 110. In a representative embodiment of the present disclosure, the third encapsulant 980 may be formed to cover the first surface 110a of the pattern layer 110 and may expose the conductive members 850 to the outside. The third encapsulant 980 may be configured such that it is formed on the first surface 110a of the pattern layer 110 so as to cover both of the pattern layer 110 and the conductive members 850 and may then be subjected to grinding to expose a first surface 850a of each of the conductive members 850 to the outside. The first surface 850a of each of the conductive members 850 and a surface of the third encapsulant 980 having undergone grinding, may be coplanar. The third encapsulant 980 may protect the first surface 110a of the pattern layer 110 from external environment factors.

In the example of FIG. 13, the solder balls 990 are electrically connected to the conductive members 850 exposed to the outside of the third encapsulant 980. The solder balls 990 may be solder in a shape of a ball. The solder balls 990 allow a semiconductor device such as the semiconductor device 900 according to the present disclosure to be mounted on, by way of example and not limitation, a mother board or a main board of an electronic device, such as a computer or a smart phone, for example.

Figure 14:
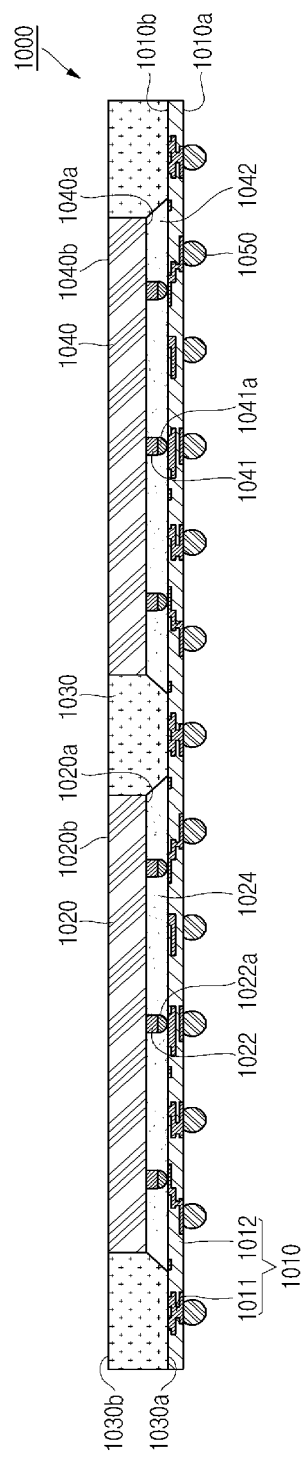
FIG. 14 is a cross-sectional view of an exemplary semiconductor device, in accordance with yet another representative embodiment of the present disclosure.

FIG. 14 is a cross-sectional view of an exemplary semiconductor device, in accordance with yet another representative embodiment of the present disclosure.

As illustrated in the example of FIG. 14, the semiconductor device 1000 includes a pattern layer 1010, a first semiconductor die 1020 having first conductive pillars 1022, a second semiconductor die 1040 having second conductive pillars 1041, a first encapsulant 1030 encapsulating the first semiconductor die 1020 and the second semiconductor die 1040, and a plurality of conductive members 1050 formed on the pattern layer 1010.

The pattern layer 1010 of FIG. 14 includes conductive pattern 1011 and a dielectric layer 1012. The conductive pattern 1011 of FIG. 14 is electrically protected by the dielectric layer 1012. The conductive pattern 1011 may, for example, have a multi-layered structure, but aspects of the present disclosure are not limited thereto. The conductive pattern 1011 of FIG. 14 is exposed to the outside through a first surface 1010a and a second surface 1010b of the pattern layer 1010. The conductive pattern 1011 exposed to the outside through the first and second surfaces 1010a, 1010b of the pattern layer 1010, respectively, may have a relatively large width to facilitate bumping in a later stage. A portion of the conductive pattern 1011 having the relatively large width may be defined as a conductive pad.

As shown in FIG. 14, the conductive pattern 1011 exposed to the first surface 1010a of the pattern layer 1010 may be connected to lands as the conductive members 850. The conductive pattern 1011 exposed to the second surface 1010b of the pattern layer 1010 is connected to the first conductive pillars 1022 of the first semiconductor die 1020 and the second conductive pillars 1041 of the second semiconductor die 1040. In the pattern layer 1010, the first surface 1010a may be a bottom surface, the second surface 1010b may be a top surface, and a surface connecting the first surface 1010a and the second surface 1010b may be a lateral surface.

The pattern layer 1010 may be implemented on a wafer in a semiconductor FAB process. A thickness of the pattern layer 1010, corresponding to a distance between the first surface 1010a and the second surface 1010b of the pattern layer 1010 implemented in the semiconductor FAB process, may be in a range of 1 to 10 μm, and the conductive pattern 1011 may have a line width in a range of 0.1 to 20 μm. In accordance with a representative embodiment of the present disclosure, a line width implemented in a semiconductor packaging process may be considerably greater than a line width implemented in a semiconductor FAB process. In a representative embodiment of the present disclosure, a semiconductor device such as the semiconductor device 1000 may be reduced in size due to a reduction in the thickness of the pattern layer 1010, and the conductive pattern 1011 may be formed as a fine pattern. In this way, miniaturization and improvement in the integration level of such semiconductor devices can be achieved.

In a representative embodiment of the present disclosure, the first semiconductor die 1020 may be shaped as a plate having a first surface 1020a that is substantially planar and a second surface 1020b opposite to the first surface 1020a. As shown in FIG. 14, the first semiconductor die 1020 may include a plurality of first conductive pillars 1022 formed on the first surface 1020a. The first surface 1020a of the first semiconductor die 1020 faces the second surface 1010b of the pattern layer 1010. The first conductive pillars 1022 may be connected to the conductive pattern 1011 exposed to the second surface 1010b of the pattern layer 1010 and may include a solder cap 1022a formed at an end of each of the first conductive pillars 1022 to be easily connected to the conductive pattern 1011.

In a representative embodiment of the present disclosure, a first underfill 1024 may fill a gap between the first semiconductor die 1020 and the pattern layer 1010. The first underfill 1024 improves physical and mechanical coupling forces between the first semiconductor die 1020 and the pattern layer 1010 and prevents the first semiconductor die 1020 and the pattern layer 1010 from being separated from each other due to stress generated by a difference in thermal expansion coefficients of the first semiconductor die 1020 and the pattern layer 1010.

The first semiconductor die 1020 may include, by way of example, a general silicon semiconductor, a compound semiconductor, and equivalents thereof, but not limited thereto.

In a representative embodiment of the present disclosure, the second semiconductor die 1040 may be shaped as a plate having a first surface 1040a that is substantially planar and a second surface 1040b opposite to the first surface 1040a. As shown in FIG. 14, the first surface 1040a of the second semiconductor die 1040 faces the second surface 1010b of the pattern layer 1010. The second semiconductor die 1040 includes second conductive pillars 1041 formed on the first surface 1040a. The second conductive pillars 1041 may be connected to the conductive pattern 1011 exposed to the second surface 1010b of the pattern layer 1010 and may include a solder cap 1041a formed at an end of each of the second conductive pillars 1041 to be easily connected to the conductive pattern 1011.

The second conductive pillars 1041 may be made of, for example, copper, but aspects of the present disclosure are not limited thereto.

The second underfill 1042 may fill a gap between the second semiconductor die 1040 and the pattern layer 1010. The second underfill 1042 may fill the gap between the second semiconductor die 1040 and the pattern layer 1010 at the time of filling with the first underfill 1024. The second underfill 1042 improves physical and mechanical coupling forces between the second semiconductor die 1040 and the pattern layer 1010 and prevents the second semiconductor die 1040 and the pattern layer 1010 from being separated from each other by stress generated due to a difference in thermal expansion coefficients of the second semiconductor die 1040 and the pattern layer 1010. In various representative embodiments of the present disclosure, the second semiconductor die 1040 may include, for example, a general silicon semiconductor, a compound semiconductor, and equivalents thereof, but is not limited thereto.

In a representative embodiment of the present disclosure, the second semiconductor die 1040 may be disposed on the second surface 1010b of the pattern layer 1010 to be spaced apart from the first semiconductor die 1020. In addition, the second semiconductor die 1040 may be electrically connected to the first semiconductor die 1020 through the conductive pattern 1011 of the pattern layer 1010.

As shown in the example of FIG. 14, the first encapsulant 1030 may encapsulate the first semiconductor die 1020 connected to the second surface 1010b of the pattern layer 1010 and the second semiconductor die 1040, to protect the first semiconductor die 1020 and the second semiconductor die 1040 from external environment factors. In a representative embodiment of the present disclosure, the first encapsulant 1030 may encapsulate the second surface 1010b of the pattern layer 1010, a surface of the first semiconductor die 1020 and a surface of the second semiconductor die 1040. However, the second surface 1020b of the first semiconductor die 1020 and the second surface 1040b of the second semiconductor die 1040 may be exposed to the outside from the first encapsulant 1030.

As shown in the illustration of FIG. 14, a lateral surface of the first encapsulant 1030 may be coplanar with a lateral surface of the pattern layer 1010, the first surface 1030a may make contact with the second surface 1010b of the pattern layer 1010, and the second surface 1030b may be coplanar with the second surface 1020b of the first semiconductor die 1020. The first encapsulant 1030 may, for example, be made of an epoxy resin that is an electrically insulating material, but is not limited thereto.

As shown in FIG. 14, the conductive members 1050 are electrically connected to the first surface 1010a opposite to the surface of the pattern layer 1010 on which the first semiconductor die 1020 and the second semiconductor die 1040 are mounted. The conductive members 1050 may be solder balls that are balls made of solder. The conductive members 1050 may be electrically connected to the conductive pattern 1011 exposed to the first surface 1010a of the pattern layer 1010. The solder balls as the conductive members 1050 allow a semiconductor device such as the semiconductor device 1000 according to the present disclosure to be mounted on, by way of example and not limitation, a mother board or a main board of an electronic device, such as a computer or a smart phone, for example.

The semiconductor device 1000 of FIG. 14 uses a pattern layer implemented on a wafer in a semiconductor fabrication (FAB) process as a substrate, thereby achieving miniaturization and an improved integration level.

Figure 15:
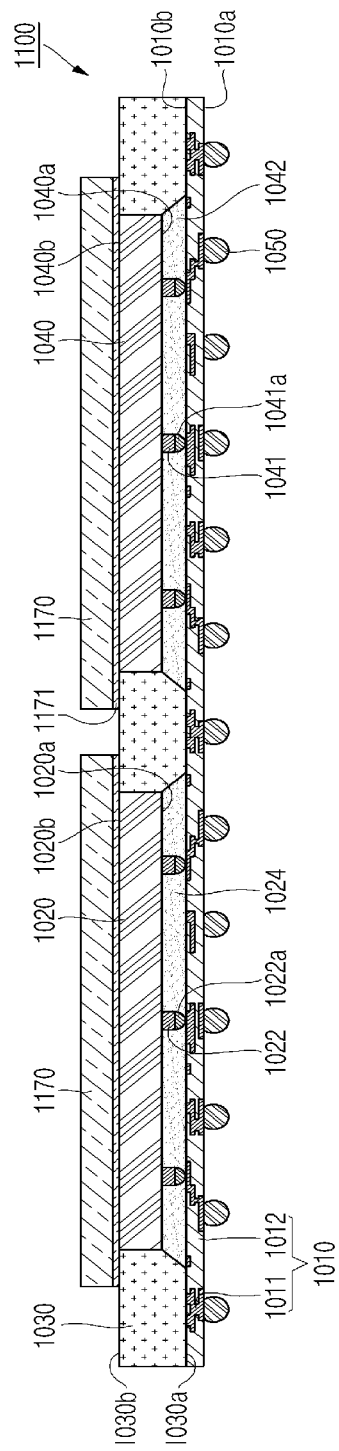
FIG. 15 is a cross-sectional view of an exemplary semiconductor device, in accordance with a further representative embodiment of the present disclosure.

FIG. 15 is a cross-sectional view of an exemplary semiconductor device, in accordance with a further representative embodiment of the present disclosure.

As illustrated in FIG. 15, the semiconductor device 1100 includes a pattern layer 1010, a first semiconductor die 1020 having first conductive pillars 1022, a second semiconductor die 1040 having second conductive pillars 1041, a first encapsulant 1030 encapsulating the first semiconductor die 1020 and the second semiconductor die 1040, conductive members 1050 formed on the pattern layer 1010, and a cover 1170 attached to a second surface 1020b of the first semiconductor die 1020 and a second surface 1040b of the second semiconductor die 1040.

As shown in FIG. 15, configurations of the pattern layer 1010, the first semiconductor die 1020, the first encapsulant 1030, the second semiconductor die 1040 and the conductive members 1050 of the semiconductor device 1100 may be the same as those of respectively corresponding components of the semiconductor device 1000 shown in FIG. 14. Therefore, the following description of the semiconductor device 1100 will focus on the covers 1170, which are a different feature from the semiconductor device 1000 shown in FIG. 14.

The covers 1170 of the example of FIG. 15 are attached to the second surface 1020b of the first semiconductor die 1020 exposed to the outside of the first encapsulant 1030 and to the second surface 1040b of the second semiconductor die 1040. The covers 1170 may be attached to the first semiconductor die 1020 and the second semiconductor die 1040 using, for example, a thermally conductive adhesive 1171. In a representative embodiment of the present disclosure, the covers 1170 may be attached to the second surface 1020b of the first semiconductor die 1020 and to the second surface 1040b of the second semiconductor die 1040, using the thermally conductive adhesive 1171. The covers 1170 may protect the second surface 1020b of the first semiconductor die 1020 and the second surface 1040b of the second semiconductor die 1040 from external environment factors. In order to improve heat dissipating performance, the covers 1170 may be made of, by way of example and not limitation, copper (Cu), aluminum (Al), or an equivalent thereof, but not limited thereto.

The present disclosure provides a semiconductor device and a manufacturing method thereof, which can achieve miniaturization and improvement in the integration level by forming a substrate using a pattern layer implemented on a wafer in a semiconductor fabrication (FAB) process.

In one aspect, the present disclosure provides a manufacturing method of a semiconductor device, the manufacturing method including preparing a first semiconductor die including a plurality of through electrodes and a plurality of first conductive pillars, mounting the first semiconductor die to connect the first conductive pillars to the pattern layer provided on a wafer, forming a first encapsulant to cover the pattern layer and the first semiconductor die, mounting a second semiconductor die to electrically connect second conductive pillars provided in the second semiconductor die to the plurality of through electrodes exposed to a second surface of the first semiconductor die, and removing the wafer from a first surface of the pattern layer. The removing of the wafer may include grinding the wafer and etching the same for removal to make only the pattern layer remain on the wafer. In the removing of the wafer, a thickness of the pattern layer, corresponding to a distance between the first surface of the pattern layer remaining after the removing of the wafer and a second surface opposite to the first surface, may be in a range between 1 μm and 10 μm. In the preparing of the first semiconductor die, the plurality of first conductive pillars may be formed on a first surface of the first semiconductor die to be connected to the plurality of through electrodes exposed to the first surface of the first semiconductor die.

The manufacturing method may further include, after the mounting of the first semiconductor die, filling a gap between the first surface of the first semiconductor die having the first conductive pillars and the pattern layer with a first underfill. The manufacturing method may also include, before the mounting of the second semiconductor die, grinding a second surface of the first semiconductor die and the first encapsulant to expose the through electrodes to the second surface of the first semiconductor die, and forming a conductive pad on the second surface of the first semiconductor die to be connected to the through electrodes. In the mounting of the second semiconductor die, the second conductive pillars of the second semiconductor die may be connected to the conductive pad. The manufacturing method may further include, after the mounting of the second semiconductor die, filling a gap between the second surface of the second semiconductor die having the second conductive pillars and the first semiconductor die with a second underfill. The manufacturing method may further include, after the removing of the wafer, forming conductive members by forming solder balls on the first surface of the pattern layer. The manufacturing method may further include, after the forming of the conductive members, forming a third encapsulant to cover the first surface of the pattern layer and to allow the solder balls to protrude to the outside. In the removing of the wafer, the wafer may be removed from the first surface of the pattern layer to allow lands formed on the first surface of the pattern layer to protrude to the outside. The manufacturing method may further include, after the removing of the wafer, forming a third encapsulant to cover the first surface of the pattern layer and to allow the lands to be exposed to the outside. The manufacturing method may further include, after the forming of the third encapsulant, forming conductive members by forming solder balls as the conductive members on the lands exposed to the outside of the third encapsulant.

In another aspect, the present disclosure provides a semiconductor device including a pattern layer having a first surface and a second surface opposite to the first surface, a first semiconductor die including a plurality of through electrodes passing through the first surface and the second surface opposite to the first surface, the through electrodes exposed to the second surface of the pattern layer electrically connected to the first surface of the first semiconductor die, a first encapsulant encapsulating the pattern layer and the first semiconductor die, the second surface of the first semiconductor die exposed to the outside, a second semiconductor die electrically connected to the through electrodes exposed to the second surface of the first semiconductor die, and conductive members electrically connected to the first surface of the pattern layer.

In a representative embodiment of the present disclosure, a thickness of the pattern layer, corresponding to a distance between the first surface and the second surface of the pattern layer, may be in a range between 1 and 10 µm, the pattern layer may include a dielectric layer for electrically disconnecting the plurality of conductive patterns and the plurality of conductive patterns from each other, and a line width of the plurality of conductive patterns may be in a range between 0.1 and 20 µm. The first semiconductor die may further include first conductive pillars connected to the through electrodes exposed to the first surface of the first semiconductor die, and the second semiconductor die may further include second conductive pillars formed on the first surface, the second conductive pillars connected to the through electrodes exposed to the second surface of the first semiconductor die.

Such a semiconductor device may further include a second encapsulant encapsulating the second semiconductor die. The second encapsulant may expose the second surface of the second semiconductor die to the outside. The semiconductor device may further include a cover attached to the second surface of the second semiconductor die exposed to the outside through the second encapsulant. The semiconductor device may further include a cover attached to the first encapsulant and the second surface of the second semiconductor die to cover the second semiconductor die. The semiconductor device may further include a wafer interposed between the pattern layer and the conductive members and including a plurality of through electrodes passing through the first surface and the second surface opposite to the first surface. The conductive members may be lands made of a conductive metal formed to protrude from the first surface of the pattern layer. The semiconductor device may further include a third encapsulant encapsulating the first surface of the pattern layer while exposing the lands to the outside. The semiconductor device may further include solder balls connected to the lands exposed to the outside through the third encapsulant. The conductive members may be solder balls shaped of balls. The semiconductor device may further include a third encapsulant encapsulating the first surface of the pattern layer while exposing the solder balls to the outside.

In still another aspect, the present disclosure provides a semiconductor device including a pattern layer having a first surface and a second surface opposite to the first surface, a first semiconductor die having a first surface connected to the second surface of the pattern layer and a second surface opposite to the first surface, a second semiconductor die having a first surface connected to the second surface of the pattern layer and a second surface opposite to the first surface, a first encapsulant encapsulating the pattern layer, the first semiconductor die and the second semiconductor die while exposing the second surface of the first semiconductor die and the second surface of the second semiconductor die to the outside, and conductive members electrically connected to the first surface of the pattern layer. A thickness of the pattern layer, corresponding to a distance between the first surface and the second surface of the pattern layer, may be in a range between 1 µm and 10 µm. The pattern layer may include a dielectric layer for electrically disconnecting the plurality of conductive patterns and the plurality of conductive patterns from each other. A line width of the plurality of conductive patterns may be in a range between 0.1 µm and 20 µm.

The first semiconductor die may further include first conductive pillars formed on the first surface of the first semiconductor die, the first conductive pillars connected to conductive patterns of the pattern layer. The second semiconductor die may further include second conductive pillars formed on the first surface of the second semiconductor die, the second conductive pillars connected to the conductive patterns of the pattern layer to be electrically connected to the first semiconductor die through the conductive patterns. The conductive members may be solder balls shaped of balls. The semiconductor device may further include a cover attached to each of the first surface of the first semiconductor die and the second surface of the second semiconductor die to cover the same.

Aspects of the present disclosure may be seen in a method of manufacturing a semiconductor device. Such a method may comprise preparing a first semiconductor die including a plurality of through electrodes and a plurality of first conductive pillars, mounting a first surface of the first semiconductor die to electrically connect the first conductive pillars to a pattern layer provided on a wafer, and forming a first encapsulant to cover the pattern layer and at least a portion of the first semiconductor die. The method may also comprise mounting a second semiconductor die to electrically connect second conductive pillars provided on the second semiconductor die to the plurality of through electrodes exposed at a second surface of the first semiconductor die, and removing the wafer from a first surface of the pattern layer. In a representative embodiment of the present disclosure, removing the wafer may comprise one or both of grinding the wafer and etching the wafer, until only the pattern layer remains. A thickness of the pattern layer corresponding to a distance between a first surface of the pattern layer and a second surface of the pattern layer opposite the first surface of the pattern layer may be in a range of 1 micron and 10 microns, and preparing the first semiconductor die may comprise forming the plurality of first conductive pillars on the first surface of the first semiconductor die connected to the plurality of through electrodes exposed at the first surface of the first semiconductor die.

In a representative embodiment of the present disclosure, the method may comprise, after said mounting a first surface of the first semiconductor die, filling a gap between the first surface of the first semiconductor die and the pattern layer with a first underfill; and may comprise, before said mounting a second semiconductor die, grinding a second surface of the first semiconductor die and the first encapsulant, to expose the through electrodes at the second surface of the first semiconductor die; and forming one or more conductive pads on the second surface of the first semiconductor die connected to corresponding through electrodes. Mounting the second semiconductor die electrically may connect the second conductive pillars of the second semiconductor die to the one or more conductive pads.

The method may further comprise, after said mounting a second semiconductor die, filling a gap between a second surface of the second semiconductor die comprising the second conductive pillars and the first semiconductor die with a second underfill; may further comprise, after said removing the wafer, forming conductive members comprising solder balls on the first surface of the pattern layer. The method may also comprise, after said forming the conductive members, forming a second encapsulant to cover the first surface of the pattern layer, allowing the solder balls to protrude to the outside. Removing the wafer from the first surface of the pattern layer may expose lands formed on the first surface of the pattern layer. The method may comprise, after said removing the wafer, forming a second encapsulant to cover the first surface of the pattern layer with the lands exposed; and may comprise, after said forming the second encapsulant, forming conductive members by forming solder balls on the lands exposed by the second encapsulant.

Additional aspects of the present disclosure may be found in a semiconductor device. Such a semiconductor device may comprise a pattern layer comprising a first pattern layer surface and a second pattern layer surface opposite to the first pattern layer surface; and a first semiconductor die comprising a first die surface, a second die surface opposite to the first die surface, and a plurality of through electrodes passing through the first and second die surfaces and electrically coupled to the second pattern layer surface. The semiconductor device may comprise a first encapsulant encapsulating the pattern layer and the first semiconductor die, where the second surface of the first semiconductor die may be exposed by the first encapsulant; a second semiconductor die electrically coupled to the through electrodes; and conductive members electrically connected to the first surface of the pattern layer. IN a representative embodiment of the present disclosure, a thickness of the pattern layer, corresponding to a distance between the first pattern layer surface and the second pattern layer surface, may be in a range between 1 micron and 10 microns, and the pattern layer may include a dielectric layer for electrically isolating a plurality of conductive patterns from each other. A line width of the plurality of conductive patterns may be in a range between 0.1 micron and 20 microns, and the first semiconductor die may comprise first conductive pillars connected to the through electrodes exposed at the first die surface of the first semiconductor die. The second semiconductor die may comprise second conductive pillars formed on a first surface of the second semiconductor die, the second conductive pillars connected to the through electrodes exposed at the second die surface of the first semiconductor die. The semiconductor device may also comprise a second encapsulant encapsulating the second semiconductor die, where a second surface of the second semiconductor die is exposed by the second encapsulant, and may comprise a cover attached to the second surface of the second semiconductor die.

Yet other aspects of the present disclosure may be observed in a semiconductor device that comprises a pattern layer. The pattern layer may comprise a first pattern layer surface and a second pattern layer surface opposite to the first pattern layer surface. The semiconductor device may also comprise a first semiconductor die comprising a first die surface connected to the second pattern layer surface and a second die surface opposite to the first die surface, and a second semiconductor die comprising a first surface connected to the second pattern layer surface and a second surface opposite to the first surface. The semiconductor device may further comprise a first encapsulant encapsulating the pattern layer, the first semiconductor die, and the second semiconductor die, where the second die surface of the first semiconductor die and the second surface of the second semiconductor die are exposed by the first encapsulant. The semiconductor device may also comprise conductive members electrically connected to the first surface of the pattern layer. A thickness of the pattern layer, corresponding to a distance between the first pattern layer surface and the second pattern layer surface, may be in a range between 1 micron and 10 micron, and wherein the pattern layer includes a dielectric layer for electrically isolating a plurality of conductive patterns from each other.

As described above, in the semiconductor device and the manufacturing method thereof according to the present disclosure, miniaturization and improvement in the integration level can be achieved by forming a substrate using a pattern layer implemented on a wafer in a semiconductor fabrication (FAB) process.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method of manufacturing a semiconductor device, the method comprising:
   preparing a first semiconductor die including a plurality of through electrodes and a plurality of first conductive pillars;
   mounting a first surface of the first semiconductor die to electrically connect the first conductive pillars to a pattern layer provided on a wafer;
   forming a first encapsulant to cover the pattern layer and at least a portion of the first semiconductor die;
   mounting a second semiconductor die to electrically connect second conductive pillars provided on the second semiconductor die to the plurality of through electrodes exposed at a second surface of the first semiconductor die; and
   removing the wafer from a first surface of the pattern layer.

2. The method of claim 1, wherein said removing the wafer comprises one or both of grinding the wafer and etching the wafer, until only the pattern layer remains.

3. The method of claim 2, wherein a thickness of the pattern layer corresponding to a distance between a first surface of the pattern layer and a second surface of the pattern layer opposite the first surface of the pattern layer, is in a range of 1 μm and 10 μm.

4. The method of claim 1, wherein said preparing the first semiconductor die comprises receiving the plurality of first conductive pillars on the first surface of the first semiconductor die connected to the plurality of through electrodes exposed at the first surface of the first semiconductor die.

5. The method of claim 4, further comprising:
after said mounting a first surface of the first semiconductor die, filling a gap between the first surface of the first semiconductor die and the pattern layer with a first underfill.

6. The method of claim 4, further comprising, before said mounting a second semiconductor die:
grinding a second surface of the first semiconductor die and the first encapsulant, to expose the through electrodes at the second surface of the first semiconductor die; and
forming one or more conductive pads on the second surface of the first semiconductor die connected to corresponding through electrodes.

7. The method of claim 6, wherein said mounting the second semiconductor die electrically connects the second conductive pillars of the second semiconductor die to the one or more conductive pads.

8. The method of claim 1, further comprising:
after said mounting a second semiconductor die, filling a gap between a second surface of the second semiconductor die comprising the second conductive pillars and the first semiconductor die with a second underfill.

9. The method of claim 1, further comprising:
after said removing the wafer, forming conductive members comprising solder balls on the first surface of the pattern layer.

10. The method of claim 9, further comprising:
after said forming the conductive members, forming a second encapsulant to cover the first surface of the pattern layer, allowing the solder balls to protrude to the outside.

11. The method of claim 1, wherein said removing the wafer from the first surface of the pattern layer exposes lands formed on the first surface of the pattern layer.

12. The method of claim 11, further comprising:
after said removing the wafer, forming a second encapsulant to cover the first surface of the pattern layer with the lands exposed.

13. The method of claim 12, further comprising:
after said forming the second encapsulant, forming conductive members by forming solder balls on the lands exposed by the second encapsulant.

14. A method of manufacturing a semiconductor device, the method comprising:
mounting a first semiconductor die to a pattern layer on a wafer, the pattern layer comprising a dielectric layer and at least one conductive pattern in contact with the wafer at a first surface of the pattern layer, the pattern layer having a second surface opposite the first surface, a first surface of the first semiconductor die comprising a plurality of through electrodes and a plurality of first conductive pillars, wherein mounting comprises electrically connecting the first conductive pillars of the first semiconductor die to the second surface of the pattern layer;
forming a first encapsulant to cover the pattern layer and at least a portion of the first semiconductor die;
mounting a second semiconductor die to electrically connect second conductive pillars provided on the second semiconductor die to the plurality of through electrodes exposed at a second surface of the first semiconductor die; and
removing the wafer from a first surface of the pattern layer.

15. The method of claim 14, wherein the at least one conductive pattern comprises a plurality of conductive patterns electrically isolated from one another by the dielectric layer.

16. The method of claim 1, wherein, before the second semiconductor die is mounted to the first semiconductor die, the second surface of the first semiconductor die is modified to be coplanar with the first encapsulant and to expose the plurality of through electrodes.

17. The method of claim 16, wherein conductive pads are formed at the exposed plurality of through electrodes, before the second semiconductor die is mounted to the first semiconductor die.

* * * * *